(12) United States Patent  (10) Patent No.: US 7,018,776 B2
Rushkin et al.  (45) Date of Patent: *Mar. 28, 2006

(54) STABLE NON-PHOTOSENSITIVE POLYIMIDE PRECURSOR COMPOSITIONS FOR USE IN BILAYER IMAGING SYSTEMS

(75) Inventors: Ilya Rushkin, Walpole, MA (US);
Ahmad A. Naiini, Greenwich, RI (US);
William D. Weber, Rumford, RI (US);
Don Perry, North Providence, RI (US);
Richard Hopla, Cranston, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/732,734

(22) Filed: Dec. 10, 2003

(65) Prior Publication Data

US 2004/0161711 A1  Aug. 19, 2004

Related U.S. Application Data

(60) Provisional application No. 60/432,793, filed on Dec. 12, 2002.

(51) Int. Cl.
G03C 1/795 (2006.01)
G03F 7/09 (2006.01)
G03F 7/20 (2006.01)
G03F 7/30 (2006.01)
G03F 7/38 (2006.01)
G03F 7/40 (2006.01)

(52) U.S. Cl. .................. 430/271.1; 430/325; 430/326; 430/327; 430/329; 430/330; 430/331

(58) Field of Classification Search ............ 430/271.1, 430/325, 326, 327, 329, 330, 331, 283.1, 430/906
See application file for complete search history.

(56) References Cited

U.S. PATENT DOCUMENTS 5,397,682 A * 3/1995 Matsuoka et al. ....... 430/283.1

(Continued)

*Primary Examiner*—Sin Lee
(74) *Attorney, Agent, or Firm*—Ohlandt, Greeley, Ruggiero & Perle, LLP

(57) ABSTRACT

Stable non-photosensitive polyimide precursor compositions with an adhesion promoter in a non-NMP solvent for use in forming high temperature resistant relief images and a process for making said images. The non-photosensitive polyimide precursor compositions comprise a) one or more polyamic acids soluble in gamma-butyrolactone (GBL) and aqueous tetramethyl ammonium hydroxide, and with the proviso that the polyamic acid is also resistant to a solvent used in a photosensitive composition with which the polyimide precursor composition is to be used;

b) a solvent comprising gamma-butyrolactone; and c) one or more adhesion promoters selected from structures described by Formulae I–VI

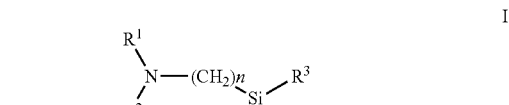

I

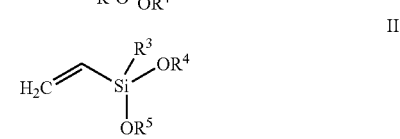

II

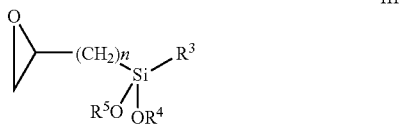

III

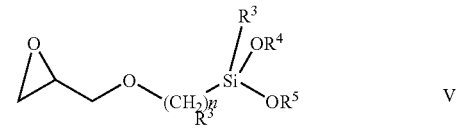

IV

V

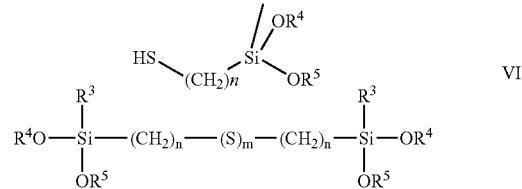

VI wherein $R^1$ is H, $C_1$–$C_{10}$ linear, cyclic or branched alkyl, phenyl or halophenyl or alkyl substituted phenyl, $R^2$ is $C_1$–$C_{10}$ linear, cyclic or branched alkyl, phenyl, halophenyl or alkyl substituted phenyl or one of the following moieties VII, VIII, or IX

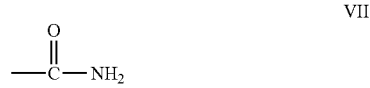

VII

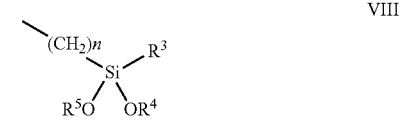

VIII

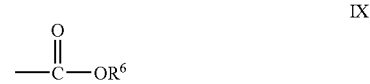

IX where $R^3$ is $C_1$–$C_4$ linear or branched alkyl or $C_1$–$C_4$ linear or branched alkoxy group, $R^4$, $R^5$ and $R^6$ are independently $C_1$–$C_4$ linear or branched alkyl group, m is an integer from 1 to about 4, and n is an integer from 1 to about 5.

36 Claims, No Drawings

U.S. PATENT DOCUMENTS 5,876,897 A * 3/1999 Durham et al. ............. 430/170
5,908,897 A * 6/1999 Nakamura et al. .......... 524/862
6,455,208 B1 * 9/2002 Yamashiki et al. ............ 430/7
2002/0100550 A1 * 8/2002 Mahdi et al. ................ 156/329
2005/0058780 A1 * 3/2005 Ono et al. ................... 428/1.2

* cited by examiner

STABLE NON-PHOTOSENSITIVE POLYIMIDE PRECURSOR COMPOSITIONS FOR USE IN BILAYER IMAGING SYSTEMS

RELATED APPLICATION

This application claims priority from U.S. Provisional Application No. 60/432,793 filed Dec. 12, 2002.

FIELD OF INVENTION

The present invention relates to a composition for preparing heat-resistant relief structures using a non-photosensitive polyimide precursor composition as part of a bilayer imaging system.

BACKGROUND OF THE INVENTION

Polymers that provide high temperature resistance, such as polyimides, are well known in microelectronic applications. Some of the uses include protective layers, insulating layers, interlevel dielectrics, and antireflective layers. In some cases, the polyimide may be coated from a solution of polyimide, but are generally coated as a polyimide precursor, such as a polyamic acid or polyamic ester, and subsequently converted to polyimides by known techniques, such as exposure to high temperatures. Frequently in the early steps of patterning applications, the properties of the polyimide precursors are more useful than the fully imidized polyimide. In the later stages, the properties of the fully imidized polyimide usually are more desired.

Preparation of polyimide patterns may use a photosensitive polyimide precursor or employ a bilayer approach where the polyimide precursor is not photosensitive. A method of patterning non-photosensitive polyimide films was described in U.S. Pat. No. 3,700,497, incorporated by reference. According to this method, a film of polyamic acid was formed on the surface of a substrate. Then, a layer of a diazonaphthoquinone/novolak type photoresist was formed on the top of the film of polyamic acid, followed by patternwise exposure using ultraviolet light. The exposed areas of photoresist and the layer of polyamic acid underneath it were etched away in a dilute organic or inorganic base developer. The remaining photoresist was removed using acetone and the film of polyamic acid was cured at temperatures higher than 250° C., creating a patterned polyimide layer to remain as part of the device structure.

The pattern profile obtained from this type of process depends on the ability to control the dissolution rate of the polyimide precursor, the thickness of the polyimide precursor, and strength and type of developer employed for the photoresist and for the polyimide precursor layers. Significant undercut of the photoresist layer can occur with high dissolution rates of the polyamic acid in the developer. This property has been utilized in preparing lift off structures from thin, sacrificial, polyimide precursor layers, which may be partially imidized, as disclosed in U.S. Pat. No. 5,360,697 and U.S. Pat. No. 5,017,459.

The dissolution rate of the polyimide precursor is a function of its chemical structure and the degree of imidization. The chemical structure of the polyimide precursor, which will subsequently form the polyimide with the properties desired for the application, may have a low dissolution rate. The polyimide precursor may be partially imidized to control dissolution rate as in U.S. Pat. No. 4,113,550. These factors may lead to development being a two-step process. First the photoresist layer is developed with one developer and then the polyimide precursor layer is developed with another developer, frequently of a different type. Two-step development processes of polyimide precursor bilayer systems are described, for example, in U.S. Pat. Nos. 4,039,371, 4,411,735, 5,374,503, 4,113,550 and 5,470,693. Typical developers employed for the polyimide precursor layer are based on amines, tetramethyl ammonium hydroxide (TMAH) in alcohol, or a mixture of tetramethyl ammonium hydroxide, water, and N-methyl pyrolidone. U.S. Pat. No. 4,039,370 discloses a developer based on tetramethyl ammonium hydroxide, water, and either acetic, tartaric or oxalic acid. U.S. Pat. No. 6,221,567 discloses a development process with multiple developer/rinse steps.

Solvents employed for polyimide precursors are typically polar solvents. Dimethyl acetamide and N-methyl pyrolidone (NMP) are the most commonly used solvents for polyimide precursors for bilayer applications. However, it has been established that nitrogen-containing solvents such as NMP have detrimental effects on the performance of chemically amplified 248 and 193 nm photoresists (U.S. Pat. No. 6,277,546; see also "Influence of Polymer Properties On Airborne Chemical Contamination of Chemically Amplified Resists", W. D, Hinsberg, S. A. MacDonald, N. J. Clecak, C. D. Snyder, and H. Ito, SPIE vol. 1925, pp. 43–52, 1993). As a result, the use of NMP-containing compositions is prohibited in many semiconductor fabrication facilities where such chemically amplified photoresists are used. NMP is difficult to remove from the polyimide precursor film because of its high boiling point and the relatively low temperature softbakes employed with the polyimide precursor film to prevent imidization. U.S. Pat. No. 5,667,922 disclosed that a process employing a water rinse step after formation of a polyamic acid film resulted in better-defined polyimide patterns because of NMP removal by the water rinse.

The use of alternate, but weaker, polar solvents such as gamma-butyrolactone is more acceptable to the industry. However, many polyimide precursor compositions with desirable cured properties are not soluble in gamma-butyrolactone.

Non-photosensitive polyimide precursor compositions are generally employed on substrates treated with adhesion promoting agents. It is desirable to reduce the cost of semiconductor devices by reducing the number of manufacturing steps. It is therefore desirable to use adhesion promoters within the non-photosensitive polyimide precursor composition to eliminate a manufacturing step. Addition of certain silane adhesion promoters to non-photosensitive polyimide precursor compositions based on polyamic acids have been found to degrade the stability of the photosensitive polyimide precursor composition.

SUMMARY OF THE INVENTION

The invention described herein discloses stable non-photosensitive polyimide precursor compositions with an adhesion promoter in a non-NMP solvent for use in forming high temperature resistant relief images and a process for making said images. The non-photosensitive polyimide precursor compositions comprise a) one or more polyamic acids soluble in gamma-butyrolactone (GBL) and aqueous tetramethyl ammonium hydroxide, and with the proviso that the polyamic acid is also resistant to a solvent used in a photosensitive composition with which the polyimide precursor composition is to be used;

b) a solvent comprising gamma-butyrolactone; and c) one or more adhesion promoters selected from the group consisting of the structures described by Formulae I–VI

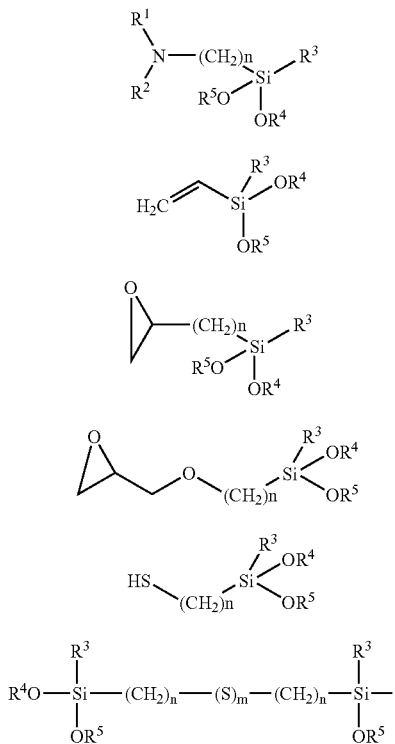

wherein $R^1$ is H, $C_1$–$C_{10}$ linear, cyclic or branched alkyl, phenyl or halophenyl or alkyl substituted phenyl, $R^2$ is $C_1$–$C_{10}$ linear, cyclic or branched alkyl, phenyl, halophenyl or alkyl substituted phenyl or one of the following moieties VII, VIII, or IX

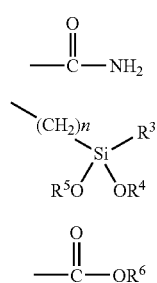

where $R^3$ is $C_1$–$C_4$ linear or branched alkyl or $C_1$–$C_4$ linear or branched alkoxy group, $R^4$, $R^5$ and $R^6$ are independently $C_1$–$C_4$ linear or branched alkyl group, m is an integer from 1 to about 4, and n is an integer from 1 to about 5.

DETAILED DESCRIPTION OF THE INVENTION

Non-photosensitive polyimide precursor compositions can be used to form high temperature relief patterns when used in combination with a photosensitive composition. A film of the non-photosensitive polyimide precursor composition is formed on a substrate and then overcoated with the photosensitive composition. The photosensitive composition is patterned and developed to provide an image. An image in the underlying non-photosensitive polyimide precursor composition is developed concurrent with the image formation in the photosensitive composition or in a subsequent step.

To be suitable for this invention, the non-photosensitive polyimide precursor composition should have several specific characteristics. It should be soluble enough in GBL to form coatings of the desired thickness. The non-photosensitive polyimide should be insoluble in the solvent used for the photosensitive composition (e.g., PGMEA resistant) to avoid intermixing of the photosensitive composition and non-photosensitive polyimide precursor composition. The term solvent (e.g., PGMEA) resistant is defined to be a dissolution rate of the polyamic acid film of less than about 600 angstroms/min. Additionally, the non-photosensitive polyimide precursor composition should not become cracked or crazed during the preparation of the photosensitive composition layer. The non-photosensitive polyimide precursor composition should also be soluble in the aqueous tetramethyl ammonium hydroxide developer.

The non-photosensitive polyimide precursor compositions comprise:

a. one or more polyamic acids soluble in gamma-butyrolactone and aqueous tetramethyl ammonium hydroxide, and with the proviso that the polyamic acid is also resistant to a solvent used in a photosensitive composition with which the polyimide precursor composition is to be used;

b. a solvent comprising gamma-butyrolactone; and c. one or more adhesion promoters selected from the group consisting of the compounds described by Formulae I–VI

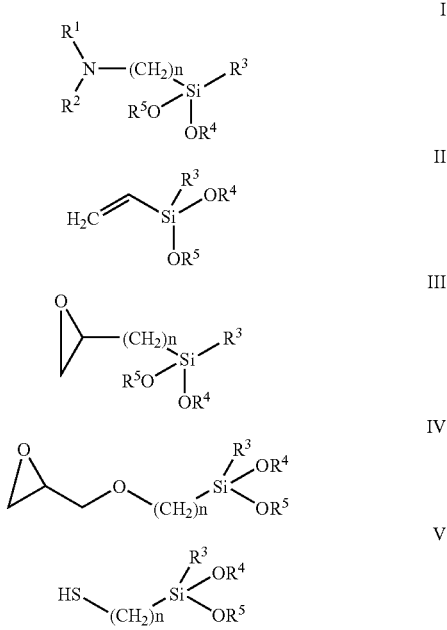

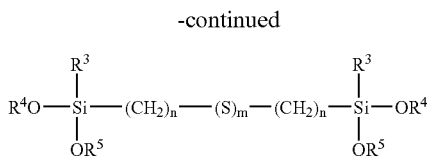

wherein R¹ is H, $C_1$–$C_{10}$ linear, cyclic or branched alkyl, phenyl or halophenyl or alkyl substituted phenyl, R² is $C_1$–$C_{10}$ linear, cyclic or branched alkyl, phenyl, halophenyl or alkyl substituted phenyl or one of the following moieties VII, VIII, or IX

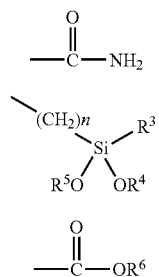

where R³ is $C_1$–$C_4$ linear or branched alkyl or $C_1$–$C_4$ linear or branched alkoxy group, R⁴, R⁵ and R⁶ are independently $C_1$–$C_4$ linear or branched alkyl group, m is an integer from 1 to about 4, and n is an integer from 1 to about 5.

The non-photosensitive polyimide precursor composition comprises one or more polyamic acids. Any polyamic acid having suitable GBL solubility, aqueous alkali solubility, and photoresist solvent resistance may be employed in this invention. Polyamic acids having the Formula X where n is an integer ranging from about 5 to about 200 are preferred for use in this invention.

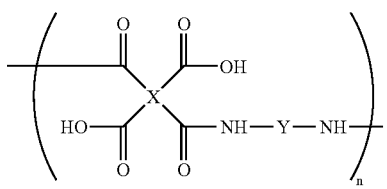

A preferred range for n is from about 25 to about 175. A more preferred range for n is from about 50 to about 150.

Polyamic acids of Formula X may be prepared by reacting monomers of Formula XI with monomers of Formula XII

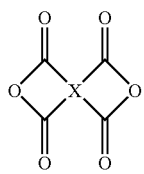

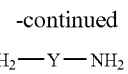

where X and Y can independently be aromatic or aliphatic moieties with or without heteroatoms or by other methods known to those skilled in the art. Monomers of Formula XI can be a single dianhydride or a mixture of two or more dianhydrides, provided that the final polymer is soluble in gamma-butyrolactone. Examples of suitable anhydrides of Formula XI include, but are not limited to the to 3,3',4,4'-biphenyltetracarboxylic acid dianhydride, 3,3',4,4' diphenylsulfidetetracarboxylic acid dianhydride, 3,3',4,4'-diphenylsulfontetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, dianhydrides of oxydiphthalic acids, particularly 3,3',4,4'-diphenyloxidetetracarboxylic acid dianhydride (4,4'-oxydiphthalic acid dianhydride), 2,3,6,7-naphthalenetetracarboxylic acid dianhydride, 1,4,5,7-naphtnalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5 naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride and 1,2,4,5-benzenetetracarboxylic acid dianhydride (pyromellitic dianhydride, PMDA). In a preferred embodiment, the dianhydride of Formula XI comprises a compound selected from the group consisting of compounds described by the structures (XIII-XV):

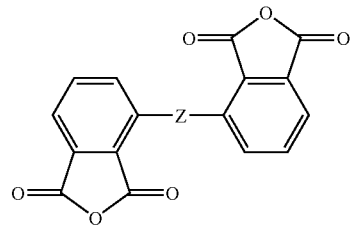

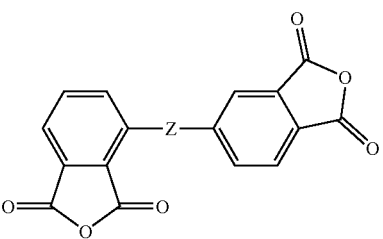

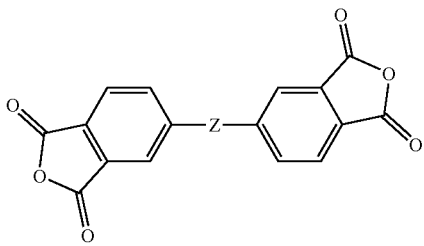

where Z=—O—, —S—, —C(CF$_3$)$_2$—, —CH$_2$—, —SO$_2$—, —NHCO— or —Si(R')$_2$— (R' is a linear, branched or cyclic alkyl group containing from 1 to 8 carbon atoms). In another preferred embodiment, the dianhydride of Formula XI comprises a mixture of two or more compounds of the Formulae XIII, XIV, and XV. In another preferred embodiment Z in Formulae XIII, XIV, and XV is —O—. In a more preferred embodiment at least 80% of the total amount of dianhydride of Formula XI comprises anhydrides described by Formulae XIII, XIV, and XV where Z=—O—.

Diamine monomers of Formula XII can be a single diamine or a mixture of two or more diamines provided that the final polymer is soluble in GBL. Examples of diamine monomers of Formula XII include but are not limited to 5(6)-amino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-amino-phenoxy) benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, and 3,3'sulfonyl-dianiline. In a preferred embodiment, diamine monomers of Formula XII comprise at least one compound having the structure XVI

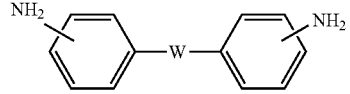

where W=—O—, —S—, —C(CF$_3$)$_2$—, —CH$_2$—, —SO$_2$—, —NHCO— or —Si(R')$_2$— (R' is a linear branched or cyclic alkyl group containing from 1 to 8 carbon atoms).

A diamine described by Formula XVI where W is —O— is a preferred diamine. In a more preferred embodiment this diamine comprises more than 80% of the total amount of diamine monomers of Formula XII. The most preferred embodiment of diamine monomer XII is 4,4'-diaminodiphenyl ether (also known as oxydianiline and ODA).

A preferred polyamic acid polymer of Formula X comprises a polymer synthesized from a dianhydride or dianhydrides of Formula XIII, XIV or XV and a diamine or diamines of Formula XVI. A more preferred polyamic acid polymer comprises a polyamic acid polymer synthesized from a dianhydride or dianhydrides of Formula XIII, XIV or XV where Z=—O— and a diamine or diamines of Formula XVI where W=—O—. Examples of preferred polymers of the present invention are polyamic acid polymers synthesized from 4,4'-diaminodiphenyl ether and 3,3',4,4'-diphenyloxidetetracarboxylic acid dianhydride (4,4'-oxydiphthalic acid dianhydride, ODPA) and a polyamic acid polymer synthesized from 4,4'-diaminodiphenyl ether and a mixture of 95–85% of ODPA and 5–15% of another anhydride of Formula XI.

The ratio of diamine to dianhydride units in the polyamic acid polymer of Formula X can vary from about 0.9 to about 1.1. A preferred polyamic acid polymer diamine to dianhydride unit ratio is from about 0.9 to about 1.

The % of polyamic acid polymer of Formula X in the composition may vary depending on the thickness desired, the molecular weight of the polymer of Formula X and the viscosity of the coating solvent. The concentration of polyamic acid polymer of Formula X in the composition is from about 1% to about 25% by weight. A preferred concentration is from about 6% to about 23%. A more preferred concentration is from about 12% to about 22% by weight. The most preferred concentration is from about 16% to about 21% by weight.

The composition used in the present invention also comprises gamma-butyrolactone as a solvent. The amount of total solvent is between about 92% and about 74% by weight of the non-photosensitive polyimide precursor composition. A cosolvent or cosolvents may also be employed up to about 20% of the total amount of solvent used with the remainder being gamma-butyrolactone. Examples of cosolvents include but are not limited to other lactones, such as gamma-valerolactone, gamma-caprolactone, and delta-valerolactone, and ketones such as 2-hexanone, 3-hexanone, 2-heptanone, 3-heptanone, and 4-methyl-2-pentanone. Suitable cosolvents should have a boiling point between about 110° C. and about 230° C.

The non-photosensitive polyimide precursor composition of this invention contains a least one adhesion promoter selected from the group consisting of compounds described by Formulae I–VI

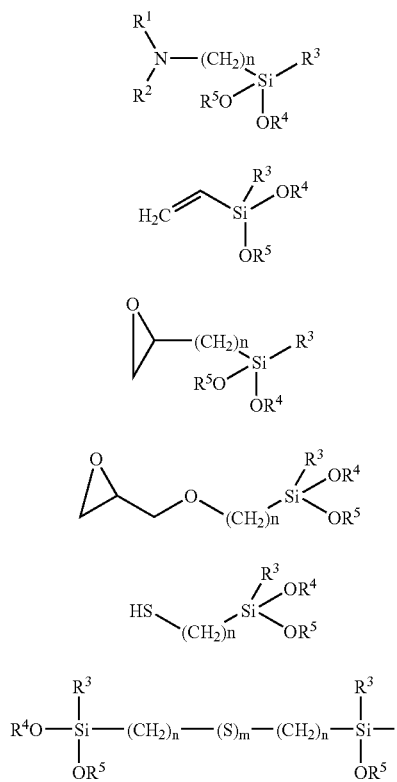

wherein $R^1$ is H, $C_1$–$C_{10}$ linear, cyclic or branched alkyl, phenyl or halophenyl or alkyl substituted phenyl, $R^2$ is $C_1$–$C_{10}$ linear, cyclic or branched alkyl, phenyl, halophenyl or alkyl substituted phenyl or one of the following moieties VII, VIII, or IX

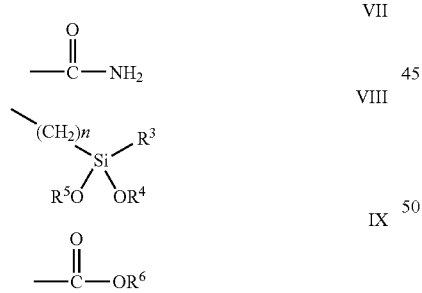

where $R^3$ is $C_1$–$C_4$ linear or branched alkyl or $C_1$–$C_4$ linear or branched alkoxy group, $R^4$, $R^5$ and $R^6$ are independently $C_1$–$C_4$ linear or branched alkyl group, m is an integer from 1 to about 4, and n is an integer from 1 to about 5. Preferred adhesion promoters are those described by Formulae I, II, IV, and V. Other adhesion promoters also preferred are those of Formula I wherein $R^1$ and $R^2$ are each independently $C_1$–$C_{10}$ linear, cyclic or branched alkyl or one of $R^1$ and $R^2$ is phenyl. Specific examples of preferred adhesion promoters include but are not limited to those of Formulae XVII, XVIII, XIX, and XX.

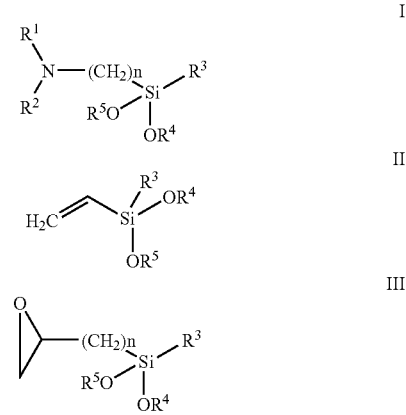

The amount of adhesion promoter in the formulation is from about 0.01 to about 2% by weight of the formulation. A preferred amount of adhesion promoter is from about 0.05% to about 1.5%. A more preferred amount of adhesion promoter is from about 0.15 to about 1% by weight and a most preferred amount is from about 0.2 to about 0.6% by weight of the formulation.

The formulation may also contain various additives such as dyes, dissolution rate modifiers or other additives. The amount of each additive in the formulation, if used, is from about 0.02 to about 2% of the formulation by weight. A preferred amount of each additive, if used, is from about 0.05–1.5% and a more preferred amount is from about 0.1 to about 1% of the formulation by weight.

The compositions of this invention may be used in a variety of processes. One process of using the non-photosensitive polyimide precursor composition comprises the steps of:

(a) providing a substrate;
(b) in a first coating step, coating the substrate with a composition comprising one or more polyamic acids soluble in gamma-butyrolactone (GBL) and aqueous tetramethyl ammonium hydroxide, a solvent comprising gamma-butyrolactone, and one or more adhesion promoters selected from the group consisting of the compounds described by Formulae I–VI -continued

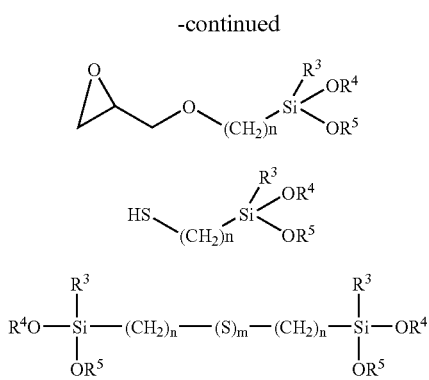

wherein $R^1$ is H, $C_1$–$C_{10}$ linear, cyclic or branched alkyl, phenyl or halophenyl or alkyl substituted phenyl, $R^2$ is $C_1$–$C_{10}$ linear, cyclic, or branched alkyl, phenyl, halophenyl or alkyl substituted phenyl or one of the following moieties VII, VIII, or IX where $R^3$ is $C_1$–$C_4$ linear or branched alkyl or $C_1$–$C_4$ linear or branched alkoxy group, $R^4$, $R^5$ and $R^6$ are independently $C_1$–$C_4$ linear or branched alkyl group, m is an integer from 1 to about 4, and n is an integer from 1 to about 5, and with the proviso that the polyamic acid is also resistant to a solvent used in a photosensitive composition with which the polyimide precursor composition is to be used, to form a layer of non-photosensitive polyimide precursor composition having a thickness of at least about 0.5 μm;

(c) baking the layer of non-photosensitive polyimide precursor composition at a temperature or temperatures below 140° C. and preferably below 130° C.;

(d) in a second coating step, coating a layer of a photoresist over the layer of non-photosensitive polyimide precursor composition to form a bilayer coating;

(e) exposing the bilayer coating to radiation suitable appropriate for the photoresist;

(f) developing the bilayer coatings with one or more aqueous developers;

(g) removing the remaining photoresist layer; and (h) curing the non-photosensitive polyimide precursor composition layer at a temperature at least about 200° C. to produce a polyimide structure.

Substrates suitable for use in this invention include, but are not limited to, silicon, aluminum, copper, chromium, nickel, gold, ferrous metals, aluminum/copper alloys, polymeric resins, silicon dioxide, doped silicon dioxide, silicone resins, silicon nitride, silicon arsenide, gallium arsenide, indium phosphide, indium selenide, indium-tin oxide, tantalum, polysilicon, inorganic glasses, and ceramics that have been spin coated with a stress buffer coating composition. The preferred substrates are thermally grown silicon oxide/silicon wafers such as those employed in the production of microprocessors, memories, and other miniaturized integrated circuit components. The most preferred substrates are silicon wafers on which all of the processes necessary to fabricate functional semiconductor devices have been completed.

Any suitable means of coating the non-photosensitive polyimide precursor composition layer may be employed. Coating of the photosensitive polyimide precursor composition of the present invention on a substrate is preferably done by a spin coating process. During the spin coating process, the silicon wafer or other substrate is placed on a vacuum chuck and spun at a high speed (e.g. 500–3,000 rpm) after or while a stress buffer composition is centrally dispersed onto the top surface of the wafer. The spin coating process parameters such as spin speed, spin time, and the like may be varied according to desired use.

After the first coating step, the coated substrate is baked. The baking may take place at one temperature or multiple temperatures. Baking may take place on a hot plate or in various types of ovens known to those skilled in the art. Suitable ovens include ovens with thermal heating, vacuum ovens with thermal heating, and infrared ovens or infrared track modules. Typical times employed for baking will depend on the chosen baking means and the desired time and temperature and will be known to those skilled in the art. A preferred method of baking is on a hot plate. When baking on a hot plate, typical times range from about 0.5 minute to about 5 minutes at temperatures typically between about 80–180° C. Lower bake temperatures and/or times increase the amount of residual solvent in the polyamic acid film, which may cause problems such as intermixing when the Deep UV photoresist is coated. Higher temperatures and times can cause imidization of the polyamic acid, resulting in lower dissolution in the developer during lithography. The degree of imidization that occurs during this bake may depend on the specific chemical structure and physical properties of the polyamic acid employed. Thus, optimum baking temperatures may vary with the specific composition. However, for the purposes of this invention the degree of imidization from baking should not prevent dissolution of the non-photosensitive polyimide precursor in the developer. A preferred baking temperature range is from about 100° C. to about 150° C. A more preferred baking temperature range is from about 115° C. to about 125° C. Other suitable baking temperature ranges are from about 110° C. to less than 140° C. or from about 110° C. to less than 130° C. Another suitable temperature range is from about 120° C. to less than 140° C. or from about 120° C. to less than 130° C. Another suitable temperature range may be from about 120° C. to about 135° C.

The thickness of the polyamic acid layer may be from about 100 nm to about 50 μm, depending on the particular application. A preferred thickness range is from about 2 μm to about 40 μm. A more preferred thickness range is from about 4 μm to about 20 μm.

In the second coating step, a layer of photoresist is coated over the film of photosensitive polyimide precursor composition. Any suitable means of coating the photoresist may be employed. A preferred method of coating of the photoresist is spin coating. Any suitable application techniques and spin rates may be used and are known to those skilled in the art.

Deep UV photoresists are described herein as illustrative of the process. However, other types of photoresists sensitive to other wavelengths may be employed with the non-photosensitive polyimide precursor composition. Examples of other suitable photoresists include those based on diazonaphthoquinonediazidesulfonic esters and phenol formaldehyde (novolac) polymers. Examples of this type of photoresist can be found in U.S. Pat. Nos. 5,063,138, 5,334,481, 4,377,631, 5,322,757, 4,992,596, and 5,554,797. These photoresists may be employed at other exposure wavelengths such as using 436 nm or 365 nm.

Deep UV photoresists useful for this invention are photosensitive compositions that image at wavelength below 250 nm. In a preferred embodiment, the Deep UV photoresists are chemically amplified photoresists and may be positive or negative acting.

Positive acting Deep UV photoresists comprise a polymer, one or more photoacid generators (PAGs) and a solvent. Representative Deep UV photoresists suitable for this invention may be found in U.S. Pat. Nos. 5,468,589, 4,491,628, 5,679,495, 6,379,861, 6,329,125, and 5,206,317, which are incorporated herein by reference. Additional additives to the Deep UV photoresists such as bases, dyes, adhesion promoters, or dissolution inhibitors may also be employed. Examples of suitable polymers for chemically amplified photoresists contain a polymer with alkali solubilizing group blocked by an acid sensitive group. Examples of suitable alkali solubilizing groups include, but are not limited to, carboxylic acids, phenols, hydroxyimides, hydroxymethylimides and fluorinated alcohols. Examples of suitable blocking groups include, but are not limited to, alkyl groups containing tertiary carbons, and alpha alkoxy alkyls, and arylisopropyl groups. Examples of suitable blocked alkali solubilizing groups include, but are not limited to, t-butyl esters, alpha alkoxy esters, t-butoxyphenyl, t-butoxyimido, and t-butoxymethylimido. Examples of blocked alkali solubilizing groups can be found in U.S. Pat. Nos. 5,468,589, 4,491,628, 5,679,495, 6,379,861, 6,329,125, and 5,206,317.

In addition to the polymer, chemically amplified photoresists suitable for this invention will also comprise photoacid generators. Any suitable photoacid generator compound may be employed in the radiation sensitive photoresist compositions. Examples of suitable photoacid generators include, but are not limited to, iodonium and sulfonium salts of carboxylic or sulfonic acids, oxime sulfonates; and nitrobenzyl esters of carboxylic or sulfonic acids.

Preferred photoacid generators are those generating sulfonic or sulfinic acids. Suitable classes of photoacid generators generating sulfonic or sulfinic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Particularly preferred are di-aryl or di-alkyl iodonium salts of strong acids or triaryl, diarylalkyl, dialkylaryl, or trialkyl substituted sulfonium salts of sulfonic acids.

Suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium trifluoromethanesulfonate, diphenylethylsulfonium chloride, phenacyidimethylsulfonium chloride, phenacyltetrahydrothiophenium chloride, 4-nitrophenacyltetrahydrothipheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutane-sulfonate, methylphenyidiphenylsulfonium perfluorooctanesulfonate, methylphenyl-diphenylsulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyidiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluoro-butanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyidiazomethane, 1-cyclohexylsulfonyl-1-(1,1-dimethylethylsulfonyl)diazomethane, bis(1,1-dimethylethyl-sulfonyl)diazomethane, bis(1-methylethylsulfonyl)diazomethane, bis(cyclohexyl-sulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthio-propiophenone, 2,4-methyl-2-(p-toluenesulfonyl)pent-3-one, 1-diazo-1-methylsulfonyl4-phenyl-2-butanone, 2-(cyclohexylcarbonyl-2-(p-toluenesulfonyl)propane, 1-cyclohexyl-sulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluene-sulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl-2-diazo-2-(p-toluene-sulfonyl)acetate, 2-nitrobenzyl p-toluenesulfonate, 2,6-dinitrobenzyl p-toluenesulfonate, and 2,4-dinitrobenzyl p-trifluoromethylbenzenesulfonate.

The photoacid generator compound is typically employed in the amounts of about 0.0001 to 20% by weight of polymer solids and more preferably about 1% to 10% by weight of polymer solids. Preferred photoacid generators are sulfonium salts. The photoacid generator may be used alone or in combination with one or more photoacid generators. The percentage of each photoacid generator in photoacid generator mixtures is between about 10% to about 90% of the total photoacid generator mixture.

Negative acting chemically amplified Deep UV photoresists typically comprise an alkali soluble polymer, a photoacid generator, a crosslinker, and a solvent. Examples of suitable polymers are polymers or copolymers having hydroxystyrene monomer units. Suitable photoacid generators are similar to those described above for positive acting Deep UV photoresists. Any suitable cross-linking agent may be used. Examples of suitable crosslinking agents include as methylolated and/or methylolated and etherified melamines, methylolated and/or methylolated and etherified guanamines and compounds containing at least two hydroxymethylphenyl groups. Examples of suitable negative acting chemically amplified Deep UV photoresists can be found in U.S. Pat. No. 6,406,829, 6,399,275, 6,245,930, 6,130,270, and 6,048,666.

The choice of solvent for the photoresist and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be removable by drying after coating. Suitable solvents for the photoresist composition may include ketones, ethers and esters, such as methyl ethyl ketone, methyl isobutyl ketone, 2-heptanone, cyclopentanone, cyclohexanone, 2-methoxy-1-propylene acetate, 2-ethoxyethyl acetate, I-methoxy-2-propyl acetate, 1,2-dimethoxy ethane, ethyl acetate, cellosolve acetate, propylene glycol monoethyl ether acetate, methyl pyruvate, ethyl pyruvate, methyl 3-methoxypropionate, ethyl 3-methoxypropionate, 1,4-dioxane, diethylene glycol dimethyl ether, and the like and the mixture thereof. More preferred solvents are propylene glycol monoethyl ether acetate, 2-heptanone, cyclohexanone, 2-ethoxyethyl acetate or mixture thereof. The most preferred solvent is propylene glycol monoethyl ether acetate.

Base additives may be added to the Deep UV photoresist. One purpose of the base additive is to scavenge protons present in the photoresist prior to being irradiated by the actinic radiation. The base prevents attack and cleavage of the acid labile groups by the undesirable acids, thereby increasing the performance and stability of the photoresist. A second purpose of the base additive is to control photoacid diffusion to control and improve resolution. The percentage of base in the composition should be significantly lower than the photoacid generator because it would not be desirable for the base to interfere with the cleavage of the acid labile groups after the photoresist composition is irradiated. A preferred range of the base compounds, when present, is from about 3% to about 50% by weight of the photoacid generator compound. Examples of useful bases include but are not limited to alkyl amines, cyclic amine, or salts of hydroxide ions. Suitable examples of base additives are 2-methylimidazole, triisopropylamine, 4-dimethylaminopryidine, 4,4'-diaminodiphenyl ether, 2,4,5-triphenylimidazole, tetrabutyl ammonium hydroxide and 1,5-diazobicyclo[4.3.0]non-5-ene.

After the second coating step, the coated substrate is baked. Baking may take place on a hot plate or in various types of ovens known to those skilled in the art. Suitable ovens include ovens with thermal heating, vacuum ovens with thermal heating, and infrared ovens or infrared track modules. Typical times employed for baking will depend on the chosen baking means and the desired time and temperature and will be known to those skilled in the art. A preferred method of baking is on a hot plate. When baking on a hot plate, typical times range from about 0.5 minute to about 5 minutes at temperatures typically from about 80° C. to about 150° C. Optimum bake parameters may vary depending on the Deep UV photoresist and solvent employed. Bake conditions should be employed which will minimize decomposition of Deep UV photoresist and control the degree of imidization of the polyamic acid to maintain dissolution properties.

The thickness of the Deep UV photoresist can be from about 0.1 μm to about 3 μm. A preferred thickness range is from about 0.5 μm to about 2.5 μm. A more preferred thickness range is from about 1 μm to about 2 μm.

Subsequently, the resulting bilayer system is exposed to light or other radiation through a mask having a desired pattern. The light or other radiation should be appropriate for the photoresist employed. Examples of suitable wavelengths of light or other radiation include 436 nm, 365 nm, 310 nm, 248 nm, 193 nm, 157 nm and electron beam or X-ray. The exposure may employ one or more wavelengths. Preferred wavelengths include 365 nm, 248 nm and 193 nm. A more preferred wavelength is 248 nm.

Following exposure to actinic radiation, it is advantageous to heat the coated substrate in an optional step to a temperature from between about 70° C. and to about 130° C. This process step is commonly referred to in the art as post exposure baking and is carried out to ensure enough acid catalyzed deblocking has occurred to differentially dissolve the more soluble portion of the photoresist coating. A preferred post exposure temperature range is from about 80° C. to about 120° C. The duration of the post exposure bake step is for a short period of time, typically from about several seconds to about several minutes when carried out on a hot plate. Other suitable baking means may be employed with the baking times being chosen to be appropriate for the method.

The bilayer film is developed using an aqueous base developer to produce a relief pattern. Examples of suitable aqueous base developers include but are not limited to inorganic alkali (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The most preferred developers are those containing tetramethylammonium hydroxide (TMAH). An appropriate amount of a surfactant or other additives may be added to the developer.

Development can be carried out by contacting the bilayer coating with the developer by means of immersion, spray, puddle development, or other similar developing methods for a few seconds up to several minutes. Development may employ one or more applications of one or more different developers to complete development of the frequently thick films and different solubilities of the exposed photoresist and the non-photosensitive polyimide precursor. These different developers may be more or less concentrated than each other or may contain different bases or different ratio of bases in them. Rinse steps with deionized water may be employed between developer treatments. Following the last developer treatment, the bilayer relief pattern is then rinsed using deionized water. An optional drying step may be employed using any suitable drying means. Examples of suitable drying means include spin drying, baking on a hot plate or an oven and is usually for a short duration of time.

After the development (or the optional drying step, if employed), the top photoresist layer is removed by dissolving it in an appropriate solvent in a process called "stripping". The stripping solvent should dissolve the photoresist layer but should not dissolve the bottom layer of polyamic acid. Suitable stripping solvents may include ketones, ethers and esters, such as methyl ethyl ketone, methyl isobutyl ketone, 2-heptanone, cyclopentanone, cyclohexanone, 2-methoxy-1-propylene acetate, 2-ethoxyethyl acetate, l-methoxy-2-propyl acetate, 1,2-dimethoxy ethane, ethyl acetate, cellosolve acetate, propylene glycol monoethyl ether acetate, methyl pyruvate, ethyl pyruvate, methyl 3-methoxypropionate, ethyl 3-methoxypropionate, 1,4-dioxane, diethylene glycol dimethyl ether, and mixtures thereof. Preferred solvents are propylene glycol monoethyl ether acetate, 2-heptanone, cyclohexanone, 2-ethoxyethyl acetate or mixtures thereof. The most preferred solvent is propylene glycol monoethyl ether acetate. The stripping process may be done by immersing the bilayer coated substrate having relief structures into the stripping solvent or, preferably, by spraying the stripping solvent over the bilayer relief structures while slowly rotating the substrate on a chuck. Subsequently, the substrate, now having only a polyamic acid relief structure coated on it, may be rinsed with fresh stripping solvent and dried by suitable drying means.

The polyamic acid is then cured to polyimide by baking the substrate with the polyamic acid relief structure at or above the glass transition temperature, $T_g$, of the polyamic acid polymer to obtain the high heat resistant polyimide. The temperature employed may vary depending on the particular polyimide and the substrate employed. The curing temperature may range from about 200° C. to about 500° C. A preferred range is from about 250° C. to about 450° C. A more preferred range is from about 300° C. to about 450° C. The cure may be accomplished using a hot plate, a heated diffusion tube, or oven and may take place at a single temperature, or several temperatures, or be ramped up over a broad temperature range. The cure time will depend on the particular heating means employed, but will typically be from about 30 minutes to 60 minutes. The atmosphere in which the bake takes place may in an inert gas, such as nitrogen, or in air.

The application of the said polyimide films in semiconductor industry include, but are not limited to, stress relieve coatings for packaged semiconductors, alpha particle barrier films, interlevel dielectrics, insulating films and patterned engineering plastic layers. The examples of articles of commerce made using the disclosed formulation and method include, but not limited to memory devices, such as DRAMs, logic devices, such as microprocessors or microcontrollers, plating stencils, etc.

The following examples are provided to illustrate the principles and practice of the present invention more clearly. It should be understood that the present invention is not limited to the examples described.

COMPARATIVE EXAMPLE 1

Preparation of Bisphenol A Dianhydride (BPADA)/oxydianiline (ODA) Polyamic Acid

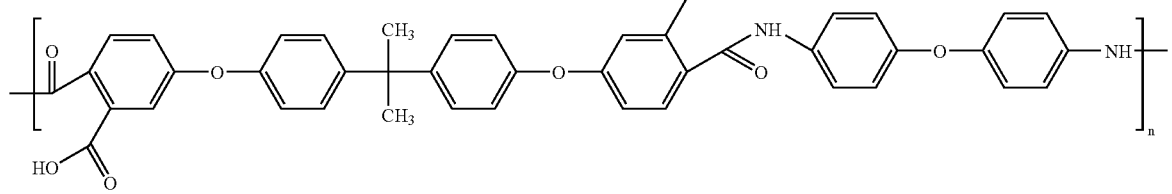

A 500 mL, three neck, round bottom flask was equipped with a mechanical stirrer, temperature controller and nitrogen inlet. 199 g of gamma-butyrolactone was added to this reaction flask followed by addition of 26.03 g (50 mmole) of bis-phenol A dianhydride (BPADA). The reaction mixture was stirred at room temperature for 15 minutes and then at 50–51° C. until bis-phenol A dianhydride was fully dissolved. The clear, pale yellow reaction solution was cooled to 15° C. In this case no precipitate was formed. 9.81 g (49 mmole) of oxydianiline was added portion wise within an hour in 3 g portions. 3.2 g gamma-butyrolactone was added to rinse the oxydianiline container into the reaction flask. The reaction temperature was kept at 15° C. for another 15 minutes and then slowly increased to 40° C. The reaction mixture was allowed to stir at this temperature for 24 hours. The kinematic viscosity of the final product was 1350 cSt. The polymer was found to be insoluble in 0.262 N aqueous tetramethyl ammonium hydroxide.

COMPARATIVE EXAMPLE 2

Preparation of 2,2'-Bis-(3,4-Dicarboxyphenyl) hexafluoropropane Dianhydride (6FDA)/oxydianiline (ODA) Polyamic Acid

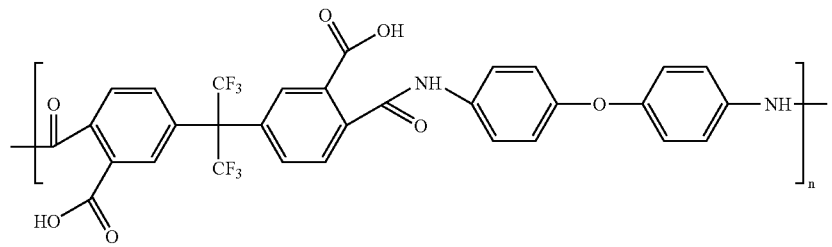

A 500 mL, three neck, round bottom flask was equipped with a mechanical stirrer, temperature controller and nitrogen inlet. 230.54 g of gamma-butyrolactone was added to this reaction flask followed by addition of 44.42 g (100 mmole) of 6FDA. The reaction mixture was stirred at room temperature for 15 minutes and then at 50–51° C. until 6FDA was fully dissolved. The clear, pale yellow reaction solution was cooled to 15° C. In this case no precipitate was formed. 19.62 g (98 mmole) of oxydianiline was added portion wise within an hour in 3 g portions. 12.81 g gamma-butyrolactone was added to rinse the oxydianiline container into the reaction flask. The reaction temperature was kept at 15° C. for another 15 minutes and then slowly increased to 40° C. The reaction mixture was allowed to stir at this temperature for 24 hours. The viscosity of the final product was 4480 cSt. The solution was diluted with 75 g of gamma-butyrolactone to achieve the final solution with a kinematic viscosity of 1029 cSt.

COMPARATIVE EXAMPLE 3

Preparation of 3,3',4,4'-biphenyltetracarboxylic Dianhydride(S-BPDA)/oxydianiline (ODA) Polyamic Acid

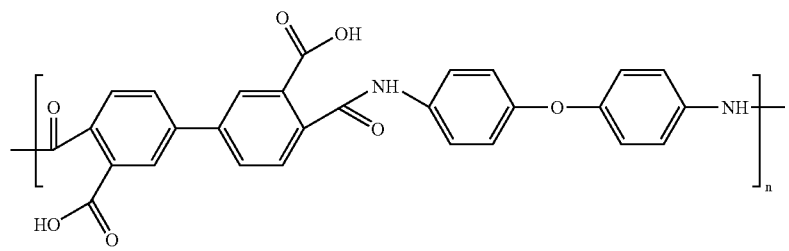

A 500 mL, three neck, round bottom flask was equipped with a mechanical stirrer, temperature controller and nitrogen inlet. 176.54 g of gamma-butyrolactone was added to this reaction flask followed by addition of 29.42 g (100 mmole) of S-BPDA. The resulting slurry was stirred at room temperature for 15 minutes and then at 50–51° C. The slurry did not dissolve. The reaction slurry was cooled to 15° C. 19.62 g (98 mmole) of oxydianiline was added portion wise within an hour in 3 g portions. 59 g gamma-butyrolactone was added to rinse the oxydianiline into the reaction flask. The reaction temperature was kept at 15° C. for another 15 minutes and then slowly increased to 40° C. The reaction mixture was allowed to stir at this temperature for 24 hours. The heavy viscous slurry did not dissolve. The reaction was discarded.

COMPARATIVE EXAMPLE 4

Preparation of Pyromellitic Dianhydride (PMDA)/oxydianiline (ODA) Polyamic Acid

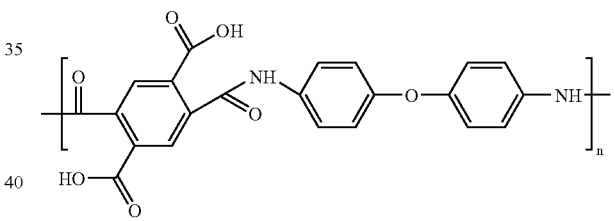

A 500 mL, three neck, round bottom flask was equipped with a mechanical stirrer, temperature controller and nitrogen inlet. 200.00 g of gamma-butyrolactone was added to this reaction flask followed by addition of 21.8 g (100 mmole) of PMDA. The resulting slurry was stirred at room temperature for 15 minutes and then at 50–51° C. The slurry did not dissolve. The reaction slurry was cooled to 15° C. 19.62 g (98 mmole) of oxydianiline was added portion wise within an hour in 3 g portions. 17.5 g gamma-butyrolactone was added to rinse the oxydianiline into the reaction flask.

The reaction temperature was kept at 15° C. for another 15 minutes and then slowly increased to 40° C. The reaction mixture was allowed to stir at this temperature for 24 hours. The heavy viscous slurry did not dissolve. The reaction was discarded.

COMPARATIVE EXAMPLE 5

Preparation of 4,4'-oxydiphthalic Anhydride (ODPA)/1,4 Phenylenediamine Polyamic Acid

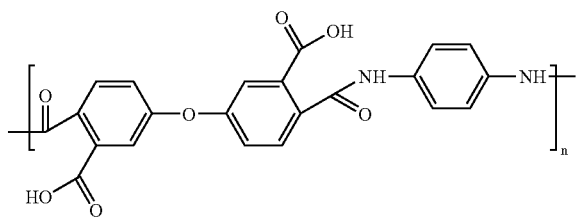

A 500 mL, three neck, round bottom flask was equipped with a mechanical stirrer, temperature controller and nitrogen inlet. 224.75 g of gamma-butyrolactone was added to this reaction flask followed by addition of 46.53 g (150 mmole) of 4,4'-oxydiphthalic anhydride (ODPA). The ODPA charging funnel was rinsed 12.5 g of gamma-butyrolactone. The reaction mixture was stirred at room temperature for 15 minutes and then at 73–75° C. until 4,4'-oxydiphthalic anhydride was fully dissolved. The clear, pale yellow reaction solution was cooled to 15° C. The 4,4'-oxydiphthalic anhydride was partially precipitated. 15.90 g (147 mmole) of 1,4-Phenylenediamine was added portion wise within an hour. 12.5 g gamma-butyrolactone was added to rinse the oxydianiline container. The reaction temperature was kept at 15° C. for another 15 minutes and then slowly increased to 40° C. The reaction mixture was allowed to stir at this temperature for 24 hours. The reaction produced black tarry solid and was discarded.

COMPARATIVE EXAMPLE 6

Preparation of 3,3',4,4'-benzophenonetetracarboxylic Dianhydride (BTDA)/4,4'-oxydianiline (ODA) Polyamic Acid

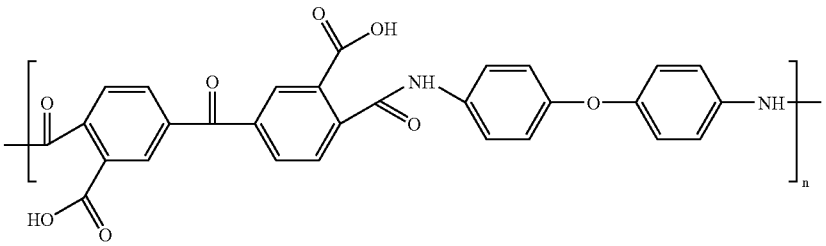

A 500 mL, three neck, round bottom flask was equipped with a mechanical stirrer, temperature controller and nitrogen inlet. 186.60 g of gamma-butyrolactone was added to this reaction flask followed by addition of 32.20 g (100 mmole) of BTDA. The BTDA charging funnel was rinsed using 10.40 g of gamma-butyrolactone. The reaction mixture was stirred at room temperature for 15 minutes and then at 95–100° C. until BTDA was fully dissolved. The clear, pale yellow reaction solution was cooled to 15° C. 19.624 g (98 mole) of ODA was added portion wise within an hour. 10.4 g gamma-butyrolactone was added to rinse the oxydianiline container. The reaction temperature was kept at 15° C. for another 15 minutes and then slowly increased to 40° C. The reaction mixture was allowed to stir at this temperature for 24 hours. The reaction produced turbid solution. The reaction mixture was discarded.

EXAMPLE 1

Preparation of 4,4'-oxydiphthalic Anhydride (ODPA)/oxydianiline (ODA) Polyamic Acid

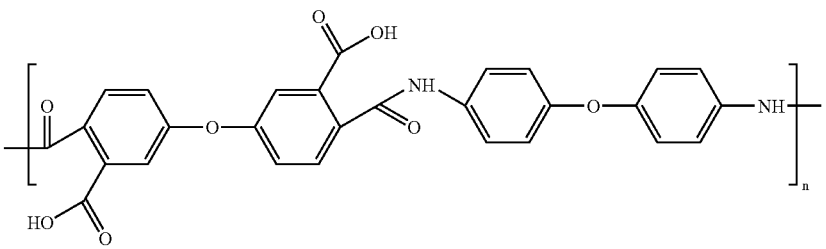

A 500 mL, three neck, round bottom flask was equipped with a mechanical stirrer, temperature controller and nitrogen inlet. 270 g of gamma-butyrolactone was added to this reaction flask followed by addition of 31.022 g (100 mmole) of 4,4'-oxydiphthalic anhydride (ODPA). The ODPA charging funnel was rinsed with 15 g of gamma-butyrolactone. The reaction mixture was stirred at room temperature for 15 minutes and then at 73–75° C. until 4,4'-oxydiphthalic anhydride was fully dissolved. The clear, pale yellow reaction solution was cooled to 15° C. The 4,4'-oxydiphthalic anhydride was partially precipitated. 19.62 g (98 mmole) of oxydianiline was added portion wise within an hour. 13.3 g gamma-butyrolactone was added to rinse the oxydianiline container. The reaction temperature was kept at 15° C. for another 15 minutes and then slowly increased to 40° C. The reaction mixture was allowed to stir at this temperature for 24 hours. The reaction was complete as evidenced by the absence of anhydride peak (1800 cm$^{-1}$) from IR spectrum of the solution. The kinematic viscosity of the final product was 1384 cSt.

EXAMPLE 2

Preparation of 4,4'-oxydiphthalic Anhydride (ODPA)-pyromellitic Dianhydride (PMDA)/oxydianiline (ODA) Polyamic Acid 40° C. The reaction mixture was allowed to stir at this temperature for 24 hours. The kinematic viscosity of the final product was 472 cSt.

EXAMPLE 3

Preparation of 4,4'-oxydiphthalic Anhydride (ODPA)/5(6)-amino-1-(4-aminophenyl)-1,3,3-trimethylindane (DAPI)/oxydianiline (ODA) Polyamic Acid

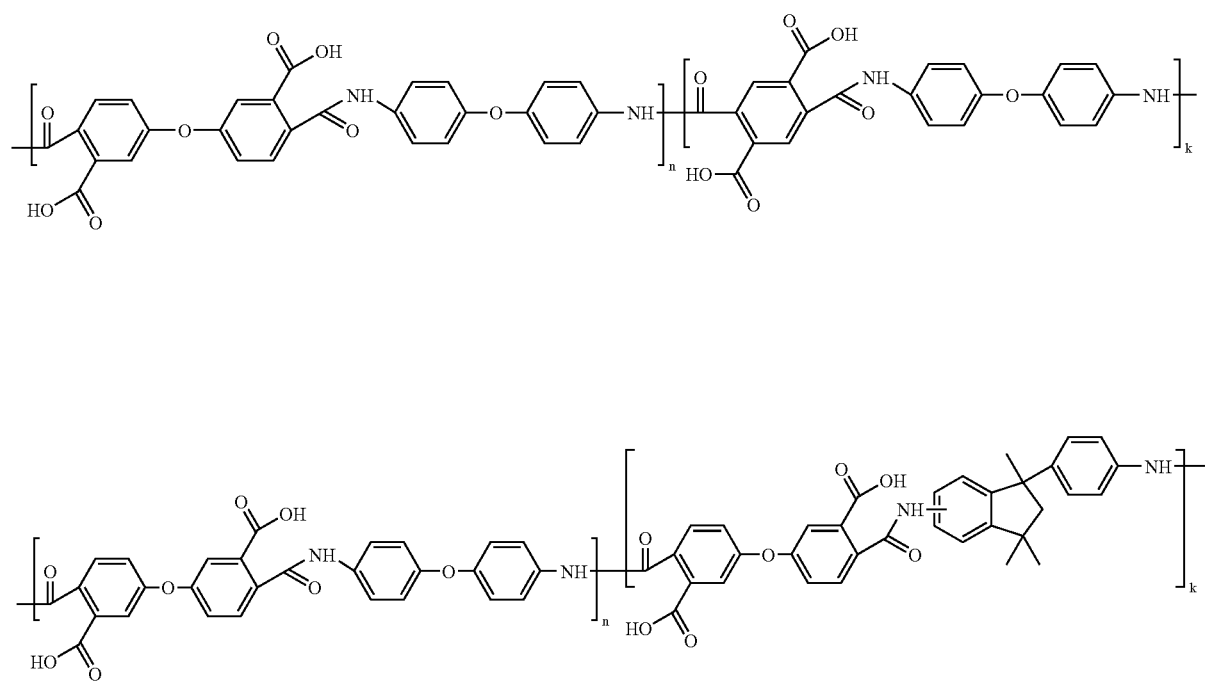

A 500 mL, three neck, round bottom flask was equipped with a mechanical stirrer, temperature controller and nitrogen inlet. 234.9 g of gamma-butyrolactone was added to this reaction flask followed by addition of 27.92 g (90 mmole) of 4,4'-oxydiphthalic anhydride (ODPA) and 2.18 g (10 mmole) of pyromellitic dianhydride (PMDA). The ODPA/PMDA charging funnel was rinsed with 13.05 g of gamma-butyrolactone. The reaction mixture was stirred at room temperature for 15 minutes and then at 70–72° C. until the anhydrides were fully dissolved. The clear, pale yellow reaction solution was cooled to 15° C. The solids partially precipitated. 19.62 g (98 mmole) of oxydianiline was added portion wise within an hour in 3 g portions. 13.3 g gamma-butyrolactone was added to rinse the oxydianiline container into the reaction flask. The reaction temperature was kept at 15° C. for another 15 minutes and then slowly increased to A 500 mL, three neck, round bottom flask was equipped with a mechanical stirrer, temperature controller and nitrogen inlet. 187 g of gamma-butyrolactone was added to this reaction flask followed by addition of 31.022 g (100 mmole) of ODPA. The reaction mixture was stirred at room temperature for 15 minutes and then at 50–51° C. until ODPA was fully dissolved. The clear, pale yellow reaction solution was cooled to 15° C. The 4,4'-oxydiphthalic anhydride was partially precipitated. 15.7 g (78.4 mmole) of oxydianiline was added portion wise within an hour in 3 g portions, followed by 5.22 g (19.6 mmole) of DAPI in 3 g portions as well. 12.81 g gamma-butyrolactone was added to rinse the oxydianiline and DAPI container into the reaction flask. The reaction temperature was kept at 15° C. for another 15 minutes and then slowly increased to 40° C. The reaction mixture was allowed to stir at this temperature for 24 hours. The kinematic viscosity of the final product was 4186 cSt.

The solution was diluted with 48 g of gamma-butyrolactone to achieve the final solution with a kinematic viscosity of 1120 cSt.

EXAMPLE 4

Preparation of 4,4'-oxydiphthalic Anhydride (ODPA)/4,3'-oxydianiline Polyamic Acid

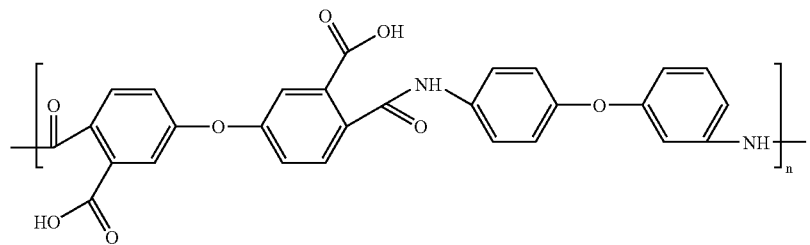

A 500 mL, three neck, round bottom flask was equipped with a mechanical stirrer, temperature controller and nitrogen inlet. 181.00 g of gamma-butyrolactone was added to this reaction flask followed by addition of 31.022 g (100 mmole) of 4,4'-oxydiphthalic anhydride (ODPA). The ODPA charging funnel was rinsed using 10 g of gamma-butyrolactone. The reaction mixture was stirred at room temperature for 15 minutes and then at 73–75° C. until 4,4'-oxydiphthalic anhydride was fully dissolved. The clear, pale yellow reaction solution was cooled to 15° C. The 4,4'-oxydiphthalic anhydride was partially precipitated. 19.22 g (96 mmole) of 4,3'-oxydianiline was added portion wise within an hour. 8 g gamma-butyrolactone was added to rinse the oxydianiline container. The reaction temperature was kept at 15° C. for another 15 minutes and then slowly increased to 40° C. The reaction mixture was allowed to stir at this temperature for 24 hours. The reaction was complete as evidenced by the absence of anhydride peak (1800 cm$^{-1}$) from IR spectrum of the solution. The kinematic viscosity of the final product was 1075 cSt.

EXAMPLE 5

Preparation of 4,4'-oxydiphthalic Anhydride (ODPA)/1,3-bis(4-aminophenoxy)benzene (TPE-R) Polyamic Acid A 500 mL, three neck, round bottom flask was equipped with a mechanical stirrer, temperature controller and nitrogen inlet. 214.83 g of gamma-butyrolactone was added to this reaction flask followed by addition of 31.022 g (100 mmole) of 4,4'-oxydiphthalic anhydride (ODPA). The ODPA charging funnel was rinsed with 11.93 g of gamma-butyrolactone. The reaction mixture was stirred at room temperature for 15 minutes and then at 70–72° C. until 4,4'-oxydiphthalic anhydride was fully dissolved. The clear, pale yellow reaction solution was cooled to 15° C. The 4,4'-oxydiphthalic anhydride was partially precipitated. 28.65 g (98 mmole) of 1,3-bis(4-aminophenoxy)benzene (TPE-R) was added portion wise within an hour (in 3 g portions). 15.63 g gamma-butyrolactone was added to rinse the 1,3-bis(4-aminophenoxy)benzene (TPE-R) container into the reaction mixture. The reaction temperature was kept at 15° C. for another 15 minutes and then slowly increased to 40° C. The reaction mixture was allowed to stir at this temperature for 24 hours. The kinematic viscosity of the final product was 1356 cSt.

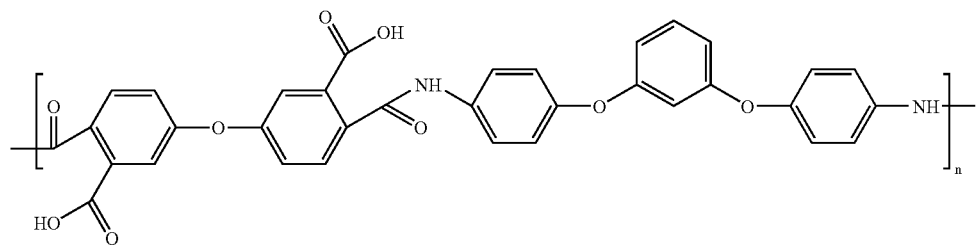

EXAMPLE 6

Preparation of 4,4'-oxydiphthalic Anhydride (ODPA)/5(6)-amino-1-(4-aminophenyl)-1,3,3-trimethylindane (DAPI) Polyamic Acid

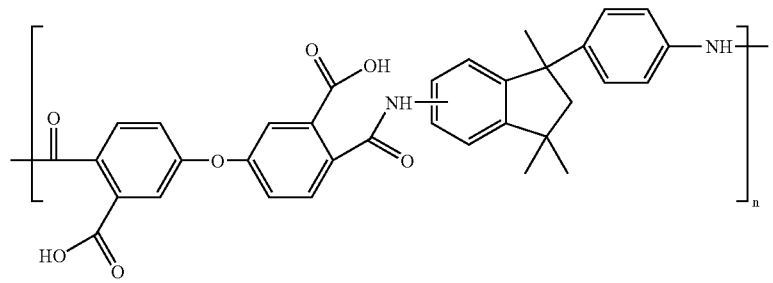

A 500 mL, three neck, round bottom flask was equipped with a mechanical stirrer, temperature controller and nitrogen inlet. 270 g of gamma-butyrolactone was added to this reaction flask followed by addition of 31.022 g (100 mmole) of 4,4'-oxydiphthalic anhydride (ODPA). The ODPA charging funnel was rinsed with 15 g of gamma-butyrolactone into the reaction flask. The reaction mixture was stirred at room temperature for 15 minutes and then at 70–72° C. until 4,4'-oxydiphthalic anhydride was fully dissolved. The clear, pale yellow reaction solution was cooled to 15° C. The 4,4'-oxydiphthalic anhydride was partially precipitated. 26.11 g (98 mmole) of DAPI was added portion wise within an hour in 3 g portions. 14.94 g gamma-butyrolactone was added to rinse the DAPI container into the reaction mixture. The reaction temperature was kept at 15° C. for another 15 minutes and then slowly increased to 40° C. The reaction mixture was allowed to stir at this temperature for 24 hours. The kinematic viscosity of the final product was 390 cSt.

EXAMPLE 7

Dissolution Rate Study of Polyamic Acids in 0.262 N Aqueous Tetramethyl Ammonium Hydroxide (TMAH) Solution The solutions of appropriate polyamic acids prepared in Examples 1–6, and Comparative Example 2 were filtered through 1 μm Teflon filter membrane. These solutions were spin coated onto a silicon wafer, which was cleaned by $O_2$ plasma in Mercator Life Systems apparatus (500 watts, 0.3–0.5 torr) for 10 min. The coated wafer was baked at 120° C. for 3 minutes. The thickness of the polyamic acid films thus obtained was 3–4 μm. The wafers were submerged into 0.262 N aqueous TMAH solution. The time needed for the polyamic acid film to dissolve was recorded from which the dissolution rate was calculated (see Table 1).

EXAMPLE 8

Dissolution Rate Study of Polyamic Acids in Propylene Glycol Methyl Ether Acetate (PGMEA)

The solutions of polyamic acids prepared in Examples 1–6, and Comparative Example 2 were filtered through 1 μm Teflon filter membrane. These solutions were spin coated onto a silicon wafer, which was cleaned by $O_2$ plasma in Mercator Life Systems apparatus (500 watts, 0.3–0.5 torr) for 10 min. The coated wafer was baked at 120° C. for 3 minutes. The thickness of the polyamic acid films thus obtained was 3–4 μm. Then, about 20 mL of propylene glycol ethyl ether acetate (PGMEA) was poured on the top of the wafers forming a puddle covering almost all surface of the wafer. After about 1 min the PGMEA was poured off and the films on the wafers were examined for damage (creases) and film thickness loss. Films that exhibited any signs of damage or/and film thickness loss more then 600 angstroms were designated as having bad PGMEA resistance. The results are in Table 1.

TABLE 1

| Example | Polyamic acid | Dissolution rate | Resistance to PGMEA |
|---|---|---|---|
| 1 | ODPA/ODA | 30 μm/min | Good |
| 2 | ODPA/PMDA/ODA | 15 μm/min | Good |
| 3 | ODPA/DAPI/ODA | 24 μm/min | Good |
| 4 | ODPA/4,3'ODA | 56 μm/min | Good |
| 5 | ODPA/TPE-R | 5 μm/min | Good |
| 6 | ODPA/DAPI | 0.4 μm/min | NA |
| Comparative 2 | 6FDA/ODA | 36 μm/min | Bad |

EXAMPLE 9

Infrared (IR) Study of ODPA/ODA Polyamic Acid Baked at Different Temperature 100 g of ODPA/ODA polyamic acid solution in GBL (16 wt %), prepared in the way similar to the one described in Example 1, were diluted with 60 g of GBL. The solution was spin coated onto double polished silicon wafers, which were cleaned by $O_2$ plasma in Mercator Life Systems apparatus (500 watts, 0.3–0.5 torr) for 10 min. The coated wafers were subjected to different softbakes, 100° C., 120° C., 140° C., 160° C. and 180° C., for 3 minutes. The thickness of the polyamic acid films thus obtained was 0.5–0.6 μm. The coated wafers, thus obtained, were examined by IR for presence of imide peak at ~1800–1850 $cm^{-1}$. The results are summarized in Table 2.

EXAMPLE 10

Dissolution Rate Measurements of ODPA/ODA Polyamic Acid Baked at Different Temperatures ODPA/ODA polyamic acid solution in GBL (16 wt %), prepared in the way similar to the one described in Example 1 was spin coated onto silicon wafers, which were cleaned by $O_2$ plasma in Mercator Life Systems apparatus (500 watts, 0.3–0.5 torr) for 10 min. The coated wafers were subjected to different softbakes, 100° C., 120° C., 140° C., 160° C. and 180° C., for 3 minutes. The thickness of the polyamic acid films thus obtained was 3–3.5 μm. The wafers were submerged into 0.262 N aqueous TMAH solution. The time needed for the polyamic acid film to dissolve was recorded from which the dissolution rate was calculated. The data is summarized in Table 2.

TABLE 2

IR and dissolution rate study of ODPA/ODA polyamic acid films baked at different temperatures.

| Bake temperature | Imide peak (~1750–1800 cm$^{-1}$) | Dissolution rate (μm/min) |
|---|---|---|
| 100° C. | None | 25 μm/min |
| 120° C. | None | 23 μm/min |
| 140° C. | Weak | 9 μm/min |
| 160° C. | Strong | <0.5 μm/min |
| 180° C. | Strong | <0.5 μm/min |

EXAMPLES 11a–18a, COMPARATIVE 8a–11a

Stability Testing of Polyamic Acid Solutions Containing Adhesion Promoter

The stability of a series of polyamic acid solutions containing various adhesion promoters (products of OSI Specialties of Greenwich, Conn.) was tested. Each formulation consisted of 2.4 g of a 10% solution of adhesion promoter in GBL added to 50 g of the 4,4'-oxydiphthalic anhydride (ODPA)/oxydianiline (ODA) polyamic acid solution prepared in Example 1. The solutions were mixed for 24 hours at room temperature and examined for gelation. Results are summarized in Table 3. Those solutions not showing signs of gelation were also filtered through a 1 μm filter to confirm the lack of gelation.

EXAMPLES 11b–13b, 16b–18b

Adhesion Test of Polyamic Acid Solutions Containing Adhesion Promoter According to ASTM D-3359-83

1 part of an adhesion promoters listed in the Table 1 was dissolved in 3 parts of gamma-butyrolactone. This solution was added drop-wise to 208 parts of 4,4'-oxydiphthalic anhydride (ODPA)/oxydianiline (ODA) polyamic acid solution of Example 1. The mixture was stirred for 24 hours and a clear solution was obtained. A silicon wafer was cleaned by $O_2$ plasma in Mercator Life Systems apparatus (500 watts, 0.3–0.5 torr) for 10 min. This solution was spin coated onto above mentioned silicon wafer. The coated wafer was baked at 120° C. for 3 minutes. The thickness of the film of polyamic acid thus obtained was 7–8 μm. A 2 μm film of Deep UV photoresist GKR-4401 (commercially available from Arch Chemicals) was prepared by coating over the polyamic acid layer by spin coating and baking at 110° C. for 90 seconds. The wafers were then exposed patternwise using a broadband mercury lamp light for 108.2 seconds (the lamp output was 1000 mJ/cm$^2$@ 400 nm during the exposure time) with Karl Suss MA-56 broadband exposure tool. A ten by ten grid of 2 mm squares was thus created. The exposed wafer was then baked at 110° C. for 60 seconds. Then, the wafer was developed in 0.262 N aqueous tetramethylamonium hydroxide using puddle development (2 puddles, 50 seconds each). The remaining photoresist was removed using an atomized spray of photoresist stripper RER 600, which is commercially available from Arch Chemicals, during a 30 second treatment while spinning at 2000 revolutions per minute. The wafer was then spun at 3000 revolutions per minute until it was dried. The patterned layer of polyamic acid was imidized under $N_2$ atmosphere at 350° C. for 1 hour. The product was then placed in a pressure cooker pot and was exposed to saturated steam at 121° C. for 100 hrs. Then, the adhesion of the film to the wafers was tested using a tape peel test using 3M tape #720 as described in ASTM D-3359-83. If no squares of the grid were peeled off, then the formulation passed the test. The results are summarized in Table 3.

TABLE 3

Results of stability and adhesion tests of non-photosensitive polyamic acid compositions containing adhesion promoters.

| Example # | Adhesion promoter structure | Formulation stability (a) | Adhesion (b) |
|---|---|---|---|
| 11 | $H_2C$=CH—$Si(OEt)_3$ | stable | Pass |
| 12 | epoxide-CH$_2$—O—(CH$_2$)$_3$—$Si(OMe)_3$ | stable | pass |
| 13 | HS—(CH$_2$)$_3$—$Si(OMe)_3$ | stable | Pass |
| 14 | $(EtO)_3Si$—(CH$_2$)$_3$—$S_4$—(CH$_2$)$_3$—$Si(OEt)_3$ | stable | NT |

TABLE 3-continued

Results of stability and adhesion tests of non-photosensitive polyamic acid compositions containing adhesion promoters.

| Example # | Adhesion promoter structure | Formulation stability (a) | Adhesion (b) |
|---|---|---|---|
| 15 | 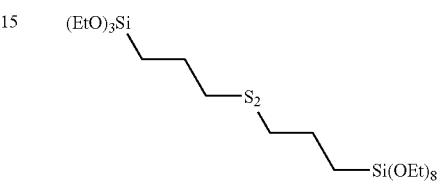 (EtO)$_3$Si—\~\~—S$_2$—\~\~—Si(OEt)$_8$ | stable | NT |
| 16 | 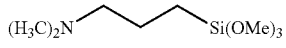 (H$_3$C)$_2$N—\~\~—Si(OMe)$_3$ | Stable | pass |
| 17 | 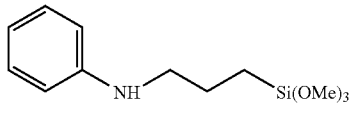 Ph-NH—\~\~—Si(OMe)$_3$ | stable | Pass |
| 18 | 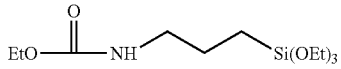 EtO—C(O)—NH—\~\~—Si(OEt)$_3$ | Stable | pass |
| Comparative Example 8 | 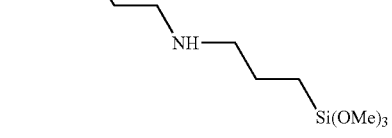 H$_2$N—\~\~—NH—\~\~—Si(OMe)$_3$ | Gelled; unstable | NT |
| Comparative Example 9 | 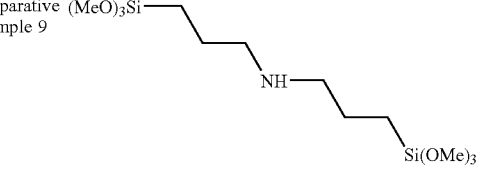 (MeO)$_3$Si—\~\~—NH—\~\~—Si(OMe)$_3$ | Gelled; unstable | NT |
| Comparative Example 10 | 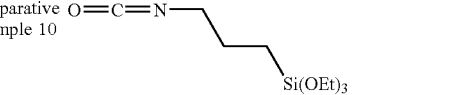 O=C=N—\~\~—Si(OEt)$_3$ | gelled | NT |
| Comparative Example 11 | 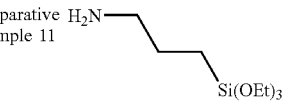 H$_2$N—\~\~—Si(OEt)$_3$ | Gelled: unstable | NT |

NT = not tested

LITHOGRAPHIC EXAMPLE 1

Lithographic Evaluation of 4,4'-oxydiphthalic Anhydride (ODPA)/oxydianiline (ODA) Polyamic Acid Along with Adhesion Promoter in Deep UV Bilayer Process 1 part of N-phenyl-gamma-aminopropyltrimethoxysilane was dissolved in 3 parts of gamma-butyrolactone. This solution was added drop-wise to 208 parts of 4,4'-oxydiphthalic anhydride (ODPA)/oxydianiline (ODA) polyamic acid solution of Example 1. The mixture was stirred for 24 hours and a clear solution was obtained. A silicon wafer was cleaned by O$_2$ plasma in Mercator Life Systems apparatus (500 watts, 0.3–0.5 torr) for 10 min. This solution was spin coated onto the cleaned silicon wafer. The coated wafer was baked at 120° C. for 3 minutes. The thickness of the film of polyamic acid thus obtained was 7–8 μm. A 2 μm film of Deep UV photoresist GKR-4401 (commercially available from Arch Chemicals) was prepared by coating over the polyamic acid layer by spin coating and baking at 110° C. for 90 seconds. The wafers were then exposed using a broadband mercury lamp light for 108.2 seconds (the lamp output was 1000 mJ/cm$^2$ @ 400 nm during the exposure time) with Karl Suss MA-56 broadband exposure tool. The exposed wafer was then baked at 110° C. for 60 seconds. Then, the pattern was developed in 0.262 N aqueous TMAH using puddle development (2 puddles, 50 seconds each). The remaining photoresist was removed using an atomized spray of photoresist stripper RER 600, which is commercially available from Arch Chemicals, during a 30 second treatment while spinning at 2000 revolutions per minute. The wafer was then spun at 3000 revolutions per minute until it was dried. The patterned layer of polyamic acid was imidized under $N_2$ atmosphere at 350° C. for 1 hour. The product was then placed in a pressure cooker pot and passed the tape peel test after 500 hours.

COMPARATIVE LITHOGRAPHIC EXAMPLE 1

Lithographic Evaluation of 4,4'-oxydiphthalic Anhydride (ODPA)/oxydianiline (ODA) Polyamic Acid in Deep UV Bilayer Process Without Adhesion Promoter A silicon wafer was cleaned by $O_2$ plasma in Mercator Life Systems apparatus (500 watts, 0.3–0.5 torr) for 10 min. 4,4'-oxydiphthalic anhydride (ODPA)/oxydianiline (ODA) polyamic acid solution of Example 1 was spin coated onto above mentioned silicon wafer. The coated wafer was baked at 120° C. for 3 minutes. The thickness of the film of polyamic acid thus obtained was 7–8 µm. A 2 µm film of Deep UV photoresist GKR-4401 (commercially available from Arch Chemicals) was prepared by coating over the polyamic acid layer by spin coating and baking at 110° C. for 90 seconds. The wafers were then exposed using a broadband mercury lamp light for 108.2 seconds (the lamp output 1000 mJ/cm$^2$ @ 400 nm during the exposure time) with Karl Suss MA-56 broadband exposure tool. The exposed wafer was then baked at 110° C. for 60 seconds. Then, the wafer was developed in 0.262 N aqueous TMAH using puddle development (2 puddles, 50 seconds each). The remaining photoresist was removed using an atomized spray of photoresist stripper RER 600, which is commercially available from Arch Chemicals, during a 30 second treatment while spinning at 2000 revolutions per minute. The wafer was then spun at 3000 revolutions per minute until it was dried. The patterned layer of polyamic acid was imidized under $N_2$ atmosphere at 350° C. for 1 hour. The product was then placed in a pressure cooker pot and failed the tape peel test in less than 100 hours.

LITHOGRAPHIC EXAMPLE 2

Lithographic Evaluation of 4,4'-oxydiphthalic Anhydride (ODPA)/oxydianiline (ODA) Polyamic Acid with Internal Adhesion Promoter in Deep UV Bilayer Process 1 part of N-phenyl-gamma-aminopropyltrimethoxysilane was dissolved in 182 parts of 18.3% (wt) 4,4'-oxydiphthalic anhydride (ODPA)/oxydianiline (ODA) polyamic acid solution prepared as described in the Example 1. A silicon wafer was cleaned by $O_2$ plasma in Mercator Life Systems apparatus (500 watts, 0.3–0.5 torr) for 10 min. This solution was spin coated onto above mentioned silicon wafer. The coated wafer was baked at 120° C. for 3 minutes. The thickness of the film of polyamic acid thus obtained was 7.9 µm. A 2 µm film of Deep UV photoresist GKR-4401 (commercially available from Arch Chemicals) was prepared by coating over the polyamic acid layer by spin coating and baking at 110° C. for 90 seconds. The coated silicon wafer was then exposed pattern-wise with a KrF excimer laser beam (248 nm) in a Canon FPA-3000 EX6 stepper through a photo mask containing a line/space pattern using graduated exposures in different locations. The exposed wafer was then baked at 85° C. for 90 seconds.

Then, the wafer was developed in 0.262 N aqueous TMAH using puddle development (2 puddles, 50 seconds each). The remaining photoresist was removed using an atomized spray of photoresist stripper RER 600, which is commercially available from Arch Chemicals, during a 30 second treatment while spinning at 2000 revolutions per minutes. The patterned layer of polyamic acid was imidized under $N_2$ atmosphere at 350° C. for 1 hour. The resulting patterned polyimide film had 15–25 µm features well resolved.

LITHOGRAPHIC EXAMPLE 3

Lithographic Evaluation of 4,4'-oxydiphthalic Anhydride (ODPA)/1,3-bis(4-aminophenoxy)benzene (TPE-R) Polyamic Acid in Deep UV Bilayer Process A silicon wafer was cleaned by $O_2$ plasma in Mercator Life Systems apparatus (500 watts, 0.3–0.5 torr) for 10 min. This wafer was primed with external adhesion promoter gamma-aminopropyl triethoxy silane by dispensing 1–3 mL of 1% (wt) solution of gamma-aminopropyl triethoxy silane in ethanol on the wafer and spin-drying the wafer at 4000 revolutions per minutes for 45 sec. The 4,4'-oxydiphthalic anhydride (ODPA)/1,3-bis(4-aminophenoxy)benzene (TPE-R) polyamic acid prepared in Comparative Example 1 was spin coated on the primed silicon wafer. The coated wafer was baked at 130° C. for 3 minutes. The thickness of the film of polyamic acid thus obtained was 8.37µm. A 2 µm film of Deep UV photoresist GKR-4401 (commercially available from Arch Chemicals) was prepared by coating over the polyamic acid layer by spin coating and baking at 120° C. for 90 seconds. The coated silicon wafer was then exposed pattern-wise with a KrF excimer laser beam (248 nm) in a Canon FPA-3000 EX6 stepper through a photo mask containing a line/space pattern using graduated exposures in different locations. The exposed film was baked for 90 seconds at 85° C. Then, the wafer was developed in 0.262 N aqueous TMAH using puddle development for 60 sec. The remaining photoresist was removed using an atomized spray of photoresist stripper RER 600, which is commercially available from Arch Chemicals, during a 30 second treatment while spinning at 2000 revolutions per minutes. The patterned layer of polyamic acid was imidized under $N_2$ atmosphere at 350° C. for 1 hour. Examination under electron scanning microscope revealed a residue in the exposed areas, indicating a need to better optimize the development process.

LITHOGRAPHIC EXAMPLE 4

Lithographic Evaluation of 4,4'-oxydiphthalic Anhydride (ODPA)/5(6)-amino-1-(4-aminophenyl)-1,3,3-trimethylindane (DAPI)/oxydianiline (ODA) Polyamic Acid in Deep UV Bilayer Process 1 part of vinyl triethoxysilane was dissolved in 3 parts of gamma-butyrolactone. This solution was added drop-wise to 208 parts of the ODPA/DAPI/ODA polyamic acid prepared in Example 3. The mixture was stirred for 24 hours and a clear solution was obtained.

The solution containing the ODPA/DAPI/ODA polyamic acid prepared above was spin coated on a silicon wafer. The coated wafer was baked at 130° C. for 3 minutes. An approximately 2 μm thick film of Deep UV photoresist GKR-4401 (commercially available from Arch Chemicals) was prepared by coating over the polyamic acid layer by spin coating at 2500 rpm for 30 seconds and baking at 110° C. for 90 seconds. Coating defects interfered with obtaining exact film thickness measurements. The coated silicon wafer was then exposed pattern-wise with a KrF excimer laser beam (248 nm) in a Canon FPA-3000 EX6 stepper through a photo mask containing a line/space pattern to an exposure dose of 95 mJ/cm² and baked for 90 seconds at 85° C. Then, the pattern was developed in 0.262 N aqueous TMAH using puddle development for 60 sec. The remaining photoresist was removed using an atomized spray of photoresist stripper RER 600, which is commercially available from Arch Chemicals, during a 60 second treatment while spinning at 2000 revolutions per minutes. The patterned layer of polyamic acid was imidized under $N_2$ atmosphere at 350° C. for 1 hour. The resulting patterned polyimide film had 50 μm features well resolved.

LITHOGRAPHIC EXAMPLE 5

Lithographic Evaluation of Oxydiphthalic Anhydride (ODPA)/4,3'-oxydianiline Polyamic Acid in Deep UV Bilayer Process 1 part of gamma-glycidoxypropyltrimethoxysilane was dissolved in 3 parts of gamma-butyrolactone. This solution was added drop-wise to 208 parts of the oxydiphthalic anhydride (ODPA)/4,3'-oxydianiline polyamic acid prepared in Example 4. The mixture was stirred for 24 hours and a clear solution was obtained.

The solution containing the oxydiphthalic dianhydride (ODPA)/4,3'-oxydianiline polyamic acid prepared above was spin coated on a silicon wafer. The coated wafer was baked at 130° C. for 3 minutes. The thickness of the film of polyamic acid thus obtained was about 12.1 μm. An approximately 2 μm thick film of Deep UV photoresist GKR4401 (commercially available from Arch Chemicals) was prepared by coating over the polyamic acid layer by spin coating at 2500 rpm for 30 sec and baking at 110° C. for 90 seconds. The coated silicon wafer was then exposed pattern-wise with a KrF excimer laser beam (248 nm) in a Canon FPA-3000 EX6 stepper through a photo mask containing a line/space pattern to a dose of 95 mJ/cm² and baked for 90 seconds at 85° C. Then, the pattern was developed in 0.262 N aqueous TMAH using puddle development for 60 seconds. The development process was repeated 4 times. The remaining photoresist was removed using an atomized spray of photoresist stripper RER 600, which is commercially available from Arch Chemicals, during a 60 second treatment while spinning at 2000 revolutions per minutes. The patterned layer of polyamic acid was imidized under $N_2$ atmosphere at 350° C. for 1 hour. The resulting patterned polyimide film had 50 μm features well resolved.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A non-photosensitive polyimide precursor composition comprising:

a) one or more polyamic acids soluble in gamma-butyrolactone (GBL) and aqueous tetramethyl ammonium hydroxide, and with the proviso that the polyamic acid is also resistant to a solvent used in a photosensitive composition with which the polyimide precursor composition is to be used;

b) a solvent comprising gamma-butyrolactone; and c) one or more adhesion promoters selected from the group consisting of the structures described by Formulae I–VI

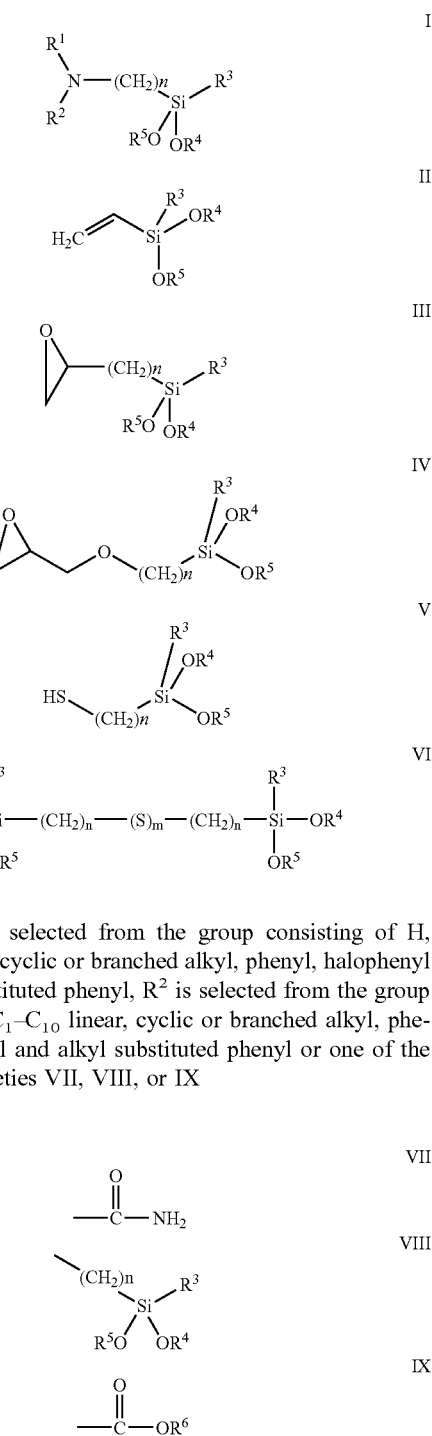

wherein $R^1$ is selected from the group consisting of H, $C_1$–$C_{10}$ linear, cyclic or branched alkyl, phenyl, halophenyl and alkyl substituted phenyl, $R^2$ is selected from the group consisting of $C_1$–$C_{10}$ linear, cyclic or branched alkyl, phenyl, halophenyl and alkyl substituted phenyl or one of the following moieties VII, VIII, or IX

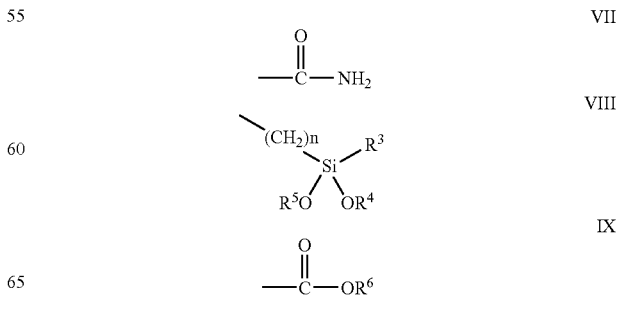

where $R^3$ is $C_1-C_4$ linear or branched alkyl or $C_1-C_4$ linear or branched alkoxy group, $R^4$, $R^5$ and $R^6$ are independently a $C_1-C_4$ linear or branched alkyl group, m is an integer from 1 to about 4, and n is an integer from 1 to about 5.

2. A composition according to claim 1 wherein the one or more polyamic acids is selected from the group consisting of polyamic acids of the Formula X

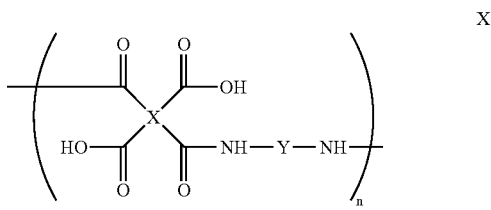

X where n is an integer ranging from about 5 to about 200 wherein X and Y are independently selected from aromatic and aliphatic moieties which may contain heteroatoms.

3. A composition according to claim 2 wherein the one or more polyamic acids of Formula X is one prepared by reacting at least one anhydride monomer of Formula XI with at least one diamine monomer of Formula XII

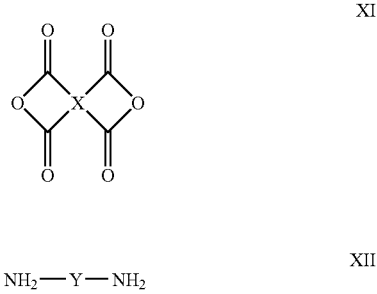

XI

NH$_2$—Y—NH$_2$

XII and wherein the anhydride monomer is selected from the group consisting of 3,3',4,4'-biphenyltetracarboxylic acid dianhydride, 3,3',4,4' diphenylsulfidetetracarboxylic acid dianhydride, 3,3'4,4'-diphenylsulfontetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, 3,3',4,4'-diphenyloxidetetracarboxylic acid dianhydride, 2,3,6,7-naphthalenetetracarboxylic acid dianhydride, 1,4,5,7-naphtnalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5 naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride and 1,2,4,5-benzenetetracarboxylic acid dianhydride, and the diamine monomer is selected from the group consisting of 5(6)-amino-1-(4-aminophenyl)-1,3,3-trimethylindane, m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-amino-phenoxy)benzene, 1,4-bis(γ-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, and 3,3'sulfonyl-dianiline.

4. A composition according to claim 3 wherein the anhydride monomer is selected from the group consisting of a compound selected from the group consisting of compounds described by the structures (XIII–XV):

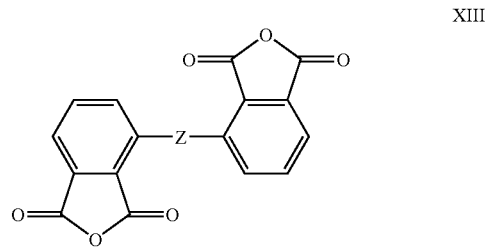

XIII

-continued

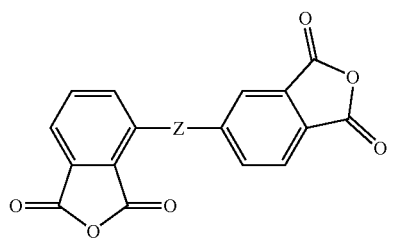

XIV

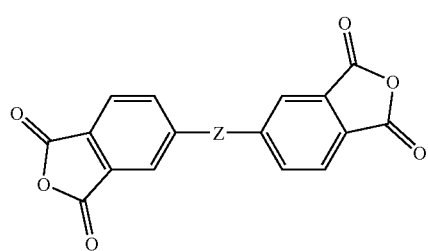

XV where Z= is selected from the group consisting of —O—, —S—, —C(CF$_3$)$_2$—, —CH$_2$—, —SO$_2$—, —NHCO— or —Si(R')$_2$— where R' is a linear, branched or cyclic alkyl group containing from 1 to 8 carbon atoms.

5. A composition according to claim 4 wherein the diamine monomer is at least one compound having the structure XVI

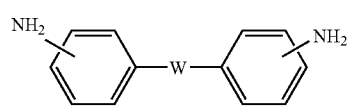

XVI where W= is selected from the group consisting of —O—, —S—, —C(CF$_3$)$_2$—, —CH$_2$—, —SO$_2$—, —NHCO— and —Si(R')$_2$— where R' is a linear branched or cyclic alkyl group containing from 1 to 8 carbon atoms.

6. A composition according to claim 5 wherein Z is —O— and W is —O—.

7. A composition according to claim 3 wherein the one or more polyamic acids is a polyamic acid selected from the group consisting of those from a polyamic acid from 4,4'-diaminodiphenyl ether and 3,3',4,4'-diphenyloxidetetracarboxylic acid dianhydride, a polyamic acid polymer from 4,4'-diaminodiphenyl ether and a mixture of 95–85% of 3,3',4,4'-diphenyloxidetetracarboxylic acid dianhydride and 5–15% of another anhydride of Formula XI.

8. A composition according to claim 2 wherein the ratio of diamine to dianhydride units in the polyamic acid of Formula X is from about 0.9 to about 1.

9. A composition according to claim 1 wherein the % of polyamic acid in the composition is from about 6 to about 23% by weight of the composition.

10. A composition according to claim 1 wherein the % of polyamic acid in the composition is from about 12 to about 22% by weight of the composition.

11. A composition according to claim 10 wherein the solvent comprise from about 74% to about 92% by weight of the composition.

12. A composition according to claim 11 wherein the composition contains at least one cosolvent having a boiling point of between about 110° C. and about 230° C.

13. A composition according to claim 12 wherein the cosolvent is selected from the group consisting of gamma-valerolactone, gamma-caprolactone, delta-valerolactone, 2-hexanone, 3-hexanone, 2-heptanone, 3-heptanone, and 4-methyl-2-pentanone.

14. A composition according to claim 1 wherein the adhesion promoter is one selected from those of the Formulae I, II, IV and V.

15. A composition according to claim 1 wherein the adhesion promoter is one of Formula I wherein R$^1$ and R$^2$ are each independently C$_1$–C$_{10}$ linear, cyclic or branched alkyl or one of R$^1$ and R$^2$ is phenyl.

16. A composition according to claim 1 wherein the adhesion promoter is selected from the group consisting of those of Formulae XVII, XVIII, XIX, and XX

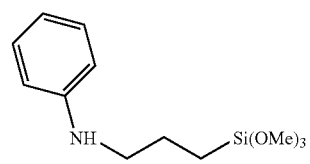

XVII

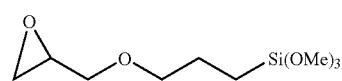

XVIII

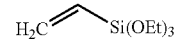

XIX

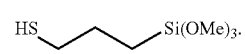

XX

17. A composition according to claim 1 wherein the adhesion promoter comprises from about 0.05% to about 1.5% by weight of the composition.

18. A process for producing a patterned polyimide structure on a substrate, the process comprising the steps of:

(a) providing a substrate;

(b) in a first coating step, coating the substrate with a non-photosensitive polyimide precursor composition of claim 1;

(c) baking the layer of non-photosensitive polyimide precursor composition at a temperature or temperatures below 140° C.;

(d) in a second coating step, coating a layer of a photoresist over the layer of non-photosensitive polyimide precursor composition to form a bilayer coating;

(e) exposing the bilayer coating to radiation suitable appropriate for the photoresist;

(f) developing the bilayer coatings with one or more aqueous developers;

(g) removing the remaining photoresist layer; and (h) curing the non-photosensitive polyimide precursor composition layer at a temperature at least about 200° C. to produce a polyimide structure.

19. A process according to claim 18 wherein the one or more polyamic acids in the non-photosensitive polyimide precursor composition is selected from the group consisting of polyamic acids of the Formula X

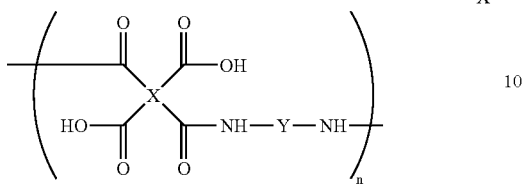

where n is an integer ranging from about 5 to about 200 wherein X and Y are independently selected from aromatic and aliphatic moieties which may contain heteroatoms.

20. A process according to claim 19 wherein the one or more polyamic acids of Formula X is one prepared by reacting at least one anhydride monomer of Formula XI with at least one diamine monomer of Formula XII

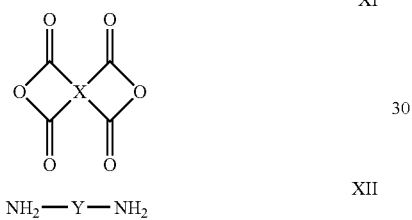

and wherein the anhydride monomer is selected from the group consisting of 3,3',4,4'-biphenyltetracarboxylic acid dianhydride, 3,3',4,4'diphenylsulfidetetracarboxylic acid dianhydride, 3,3'4,4'-diphenylsulfontetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenonetetracarboxylic acid dianhydride, 3,3',4,4'-diphenyloxidetetracarboxylic acid dianhydride, 2,3,6,7-naphthalenetetracarboxylic acid dianhydride, 1,4,5,7-naphtnalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic dianhydride, 2,2',3,3'-diphenyltetracarboxylic acid dianhydride, 3,4,9,10-perylenetetracarboxylic acid dianhydride, 1,2,4,5 naphthalenetetracarboxylic acid dianhydride, 1,4,5,8-naphthalenetetracarboxylic acid dianhydride, 1,8,9,10-phenanthrenetetracarboxylic acid dianhydride, 1,1-bis (2,3-dicarboxyphenyl)ethane dianhydride, 1,1-bis(3,4-dicarboxyphenyl)ethane dianhydride, 1,2,3,4-benzenetetracarboxylic acid dianhydride and 1,2,4,5-benzenetetracarboxylic acid dianhydride, and the diamine monomer is selected from the group consisting of 5(6)-amino-1-(4-aminophenyl)-1,3,3-trimethylindane, m-phenylenediamine, p-phenylenediamine, 2,2'-bis(trifluoromethyl)4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy)benzene, 1,4-bis(γ-aminopropyl)tetramethyidisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethyinonamethylenediamine, decamethylenediamine, ethylenediamine, propylenediamine, 2,2-dimethylpropylenediamine, 1,10-diamino-1,10-dimethyidecane, 2,11-diaminododecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl) methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis (2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, and 3,3'sulfonyl-dianiline.

21. A process according to claim 20 wherein the anhydride monomer is selected from the group consisting of a compound selected from the group consisting of compounds described by the structures (XIII–XV):

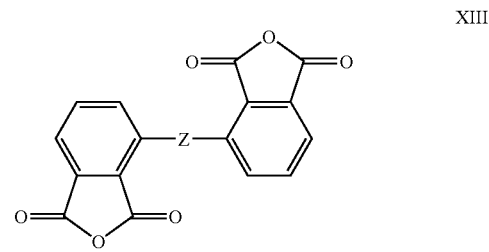

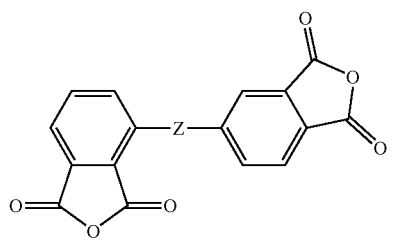

XIV

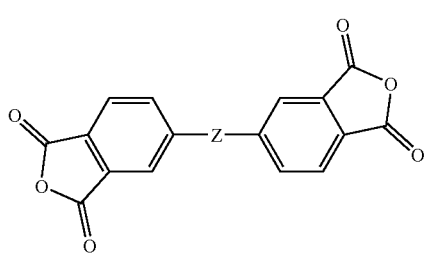

XV where Z= is selected from the group consisting of —O—, —S—, —C(CF$_3$)$_2$—, —CH$_2$—, —SO$_2$—, —NHCO— or —Si(R')$_2$— where R' is a linear, branched or cyclic alkyl group containing from 1 to 8 carbon atoms.

22. A process according to claim 21 wherein the diamine monomer is at least one compound having the structure XVI

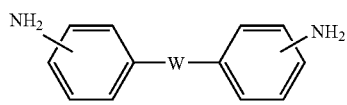

XVI where W= is selected from the group consisting of —O—, —S—, —C(CF$_3$)$_2$—, —CH$_2$—, —SO$_2$—, —NHCO— and —Si(R')$_2$— where R' is a linear branched or cyclic alkyl group containing from 1 to 8 carbon atoms.

23. A process according to claim 22 wherein Z is —O— and W is —O—.

24. A process according to claim 20 wherein the one or more polyamic acids is a polyamic acid selected from the group consisting of those from a polyamic acid from 4,4'-diaminodiphenyl ether and 3,3',4,4'-diphenyloxidetetracarboxylic acid dianhydride, a polyamic acid polymer from 4,4'-diaminodiphenyl ether and a mixture of 95–85% of 3,3',4,4'-diphenyloxidetetracarboxylic acid dianhydride and 5–15% of another anhydride of Formula XI.

25. A process according to claim 19 wherein the ratio of diamine to dianhydride units in the polyamic acid of Formula X is from about 0.9 to about 1.

26. A process according to claim 18 wherein the % of polyamic acid in the composition is from about 6 to about 23% by weight of the composition.

27. A process according to claim 18 wherein the % of polyamic acid in the composition is from about 12 to about 22% by weight of the composition.

28. A process according to claim 27 wherein the solvent comprise from about 74% to about 92% by weight of the composition.

29. A process according to claim 28 wherein the composition contains at least one cosolvent having a boiling point of between about 110° C. and about 230° C.

30. A process according to claim 29 wherein the cosolvent is selected from the group consisting of gamma-valerolactone, gamma-caprolactone, delta-valerolactone, 2-hexanone, 3-hexanone, 2-heptanone, 3-heptanone, and 4-methyl-2-pentanone.

31. A process according to claim 18 wherein the adhesion promoter is one selected from those of the Formulae I, II, IV and V.

32. A process according to claim 18 wherein the adhesion promoter is one of Formula I wherein R$^1$ and R$^2$ are each independently C$_1$–C$_{10}$ linear, cyclic or branched alkyl or one of R$^1$ and R$^2$ is phenyl.

33. A process according to claim 18 wherein the adhesion promoter is selected from the group consisting of those of Formulae XVII, XVIII, XIX, and XX

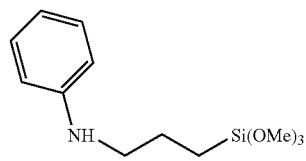

XVII

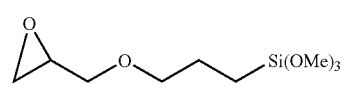

XVIII

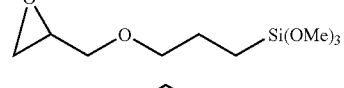

XIX

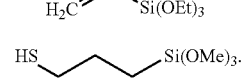

XX

34. A process according to claim 18 wherein the adhesion promoter comprises from about 0.05% to about 1.5% by weight of the composition.

35. A process according to claim 18 wherein in step c) the baking occurs at a temperature or temperatures below 130°.

36. A patterned polyimide structure on a substrate produced according to the process of claim 18.

* * * * *